United States Patent [19]

Soichi et al.

[11] Patent Number: 5,867,334

[45] Date of Patent: Feb. 2, 1999

[54] MAGNETIC RECORDING DEVICE AND METHOD USING A PUSH-PULL AMPLIFIER STRUCTURE AND SHAPING DRIVER CIRCUIT

[75] Inventors: Iwamura Soichi; Jin-kyu Jeon, both of Suwon, Rep. of Korea

[73] Assignee: Samsung Electronics Co., Ltd., Kyungki-Do, Rep. of Korea

[21] Appl. No.: 635,400

[22] Filed: Apr. 26, 1996

[30] Foreign Application Priority Data

Aug. 16, 1995 [KR] Rep. of Korea ............... 1995 25126
Sep. 22, 1995 [KR] Rep. of Korea ............... 1995 31350
Feb. 27, 1996 [KR] Rep. of Korea ............... 1996 4916

[51] Int. Cl.$^6$ ................................................ G11B 5/02
[52] U.S. Cl. ....................................... 360/68; 360/46
[58] Field of Search ............................ 360/68, 46, 42, 360/77.02, 113, 78.02, 77.01, 61; 327/58, 165; 330/263, 294, 262, 51

[56] References Cited

U.S. PATENT DOCUMENTS 5,126,891  6/1992  Ito et al. ................................ 360/61
5,296,975  3/1994  Contreras ............................. 360/46
5,351,155  9/1994  Ishii .................................... 360/46
5,483,390  1/1996  Jaffard et al. ........................ 360/62
5,612,828  3/1997  Brannon et al. ...................... 360/46

Primary Examiner—Thang V. Tran
Assistant Examiner—Patrick Wamsley
Attorney, Agent, or Firm—Sughrue, Mion, Zinn, Macpeak & Seas, PLLC

[57] ABSTRACT

Magnetic recording device and method are provided. The magnetic recording device includes a shaping driver for positive and negative signals whose polarities are reversed, corresponding to the digital information, a push-pull portion for generating a recording current corresponding to the positive and negative signals and generating a transient pulse current during reversal of the polarity of the recording current, and a current switch for switching a current flowing through the push-pull portion in response to the positive and negative signals. The digital signal is recorded on the magnetic recording medium on the basis of the transient pulse current. Therefore, without an additional recording equalizer, rise characteristics of a head current is improved and the demand of small-size and low-power is satisfied. In addition, since the magnetic recording device employs a compensation signal generator for compensating for a variation of the instantaneous value of a recording current caused by use of a rotary transformer, rise characteristics of the recording current during switching the polarity of the recording current can be maintained to be stable.

19 Claims, 21 Drawing Sheets

FIG. 1 (PRIOR ART)
FIG. 3 (PRIOR ART)
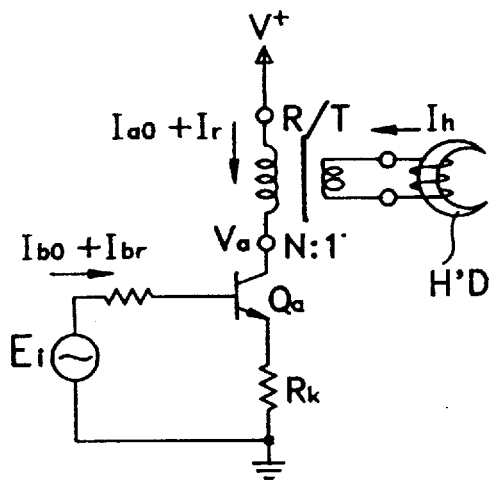
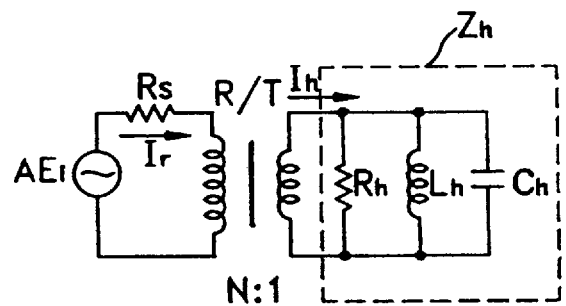
FIG. 2A (PRIOR ART)
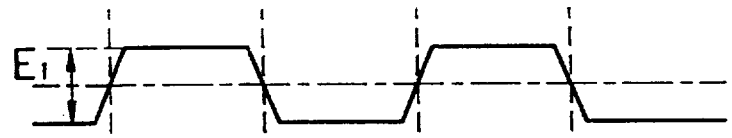
FIG. 2B (PRIOR ART)
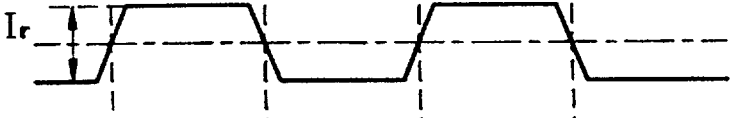
FIG. 2C (PRIOR ART)
FIG. 2D (PRIOR ART)
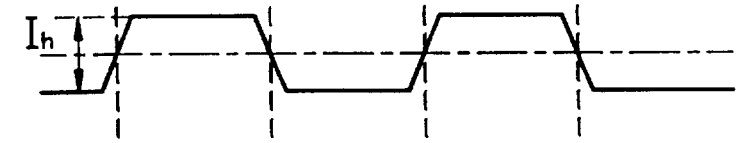

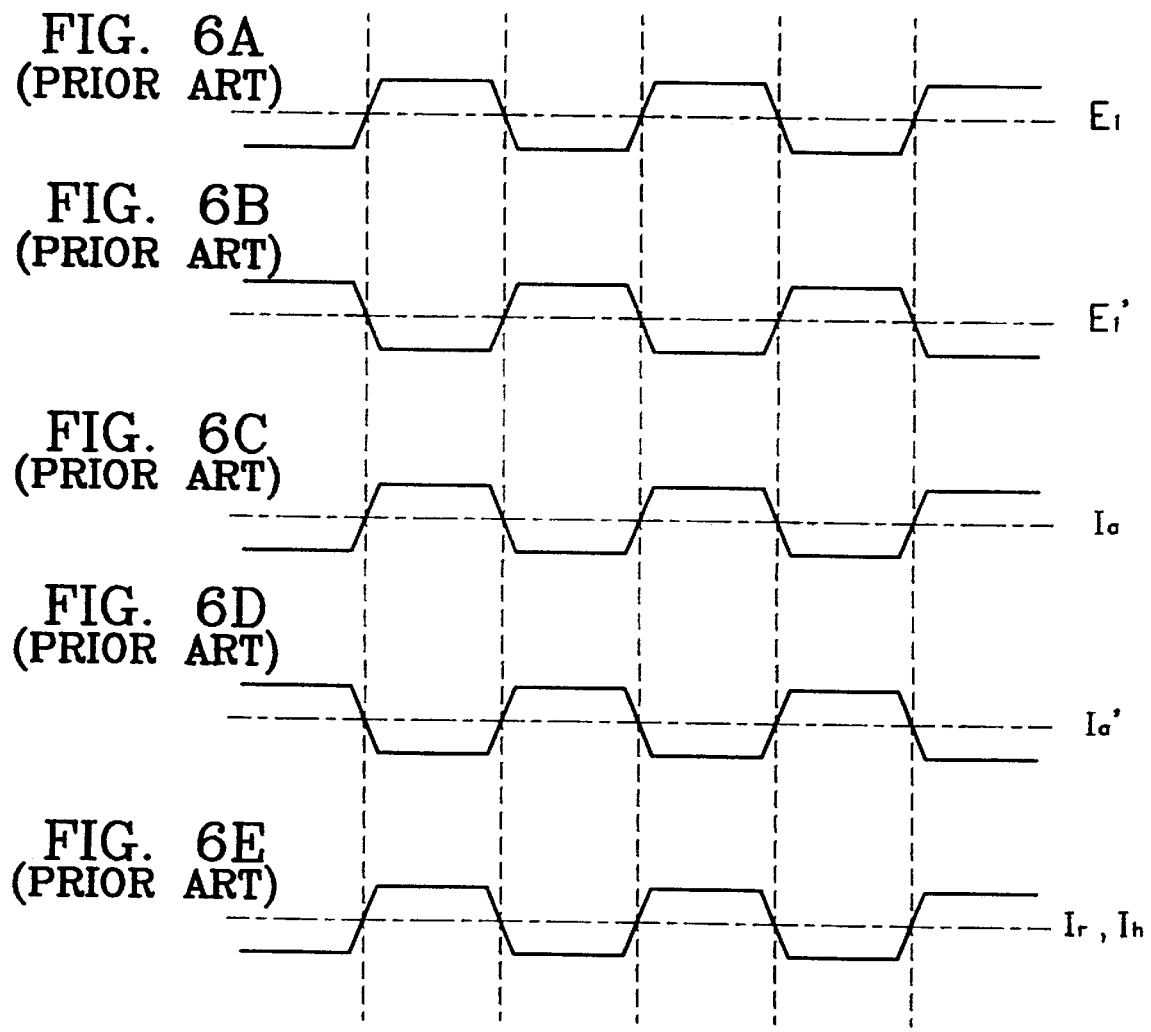

FIG. 8A (PRIOR ART)
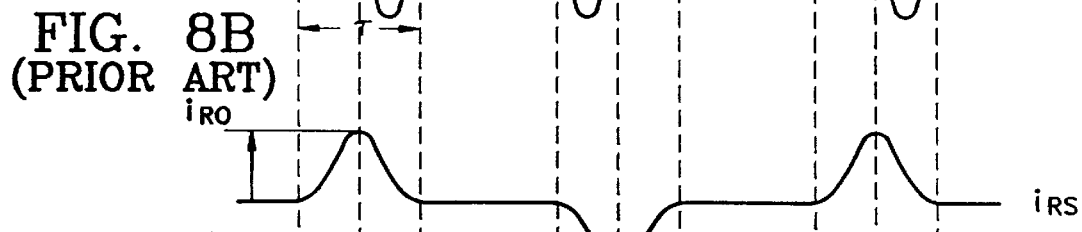
FIG. 8B (PRIOR ART)
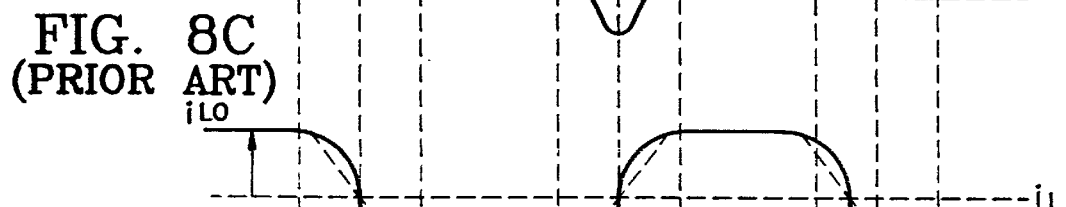
FIG. 8C (PRIOR ART)
FIG. 8D (PRIOR ART)
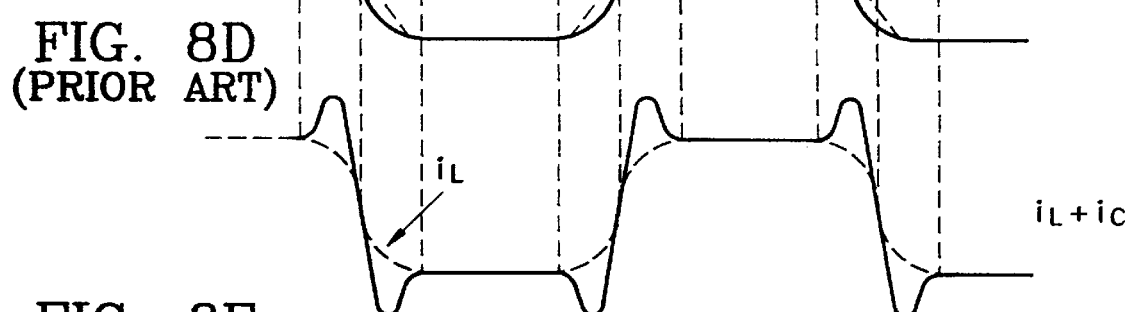
FIG. 8E (PRIOR ART)
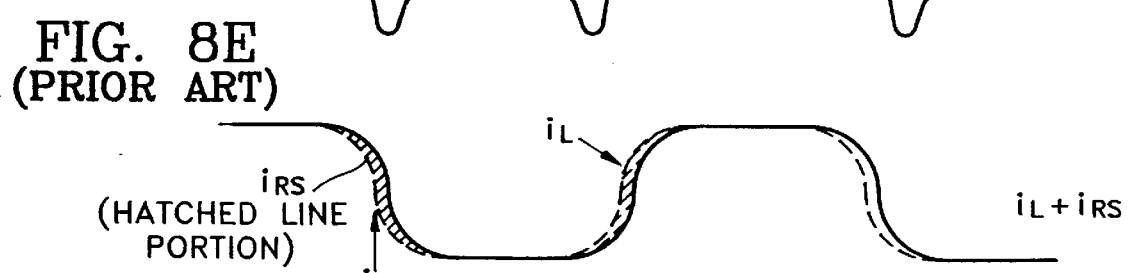
FIG. 8F (PRIOR ART)
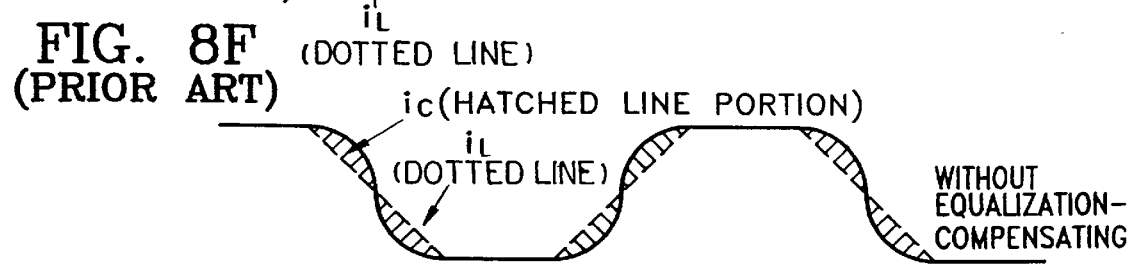
WITHOUT EQUALIZATION-COMPENSATING $E_{io}$ $E_i$ $E_i'$ $I_a, I_s'$ $I_a', I_s$ $I_K$ $I_r$

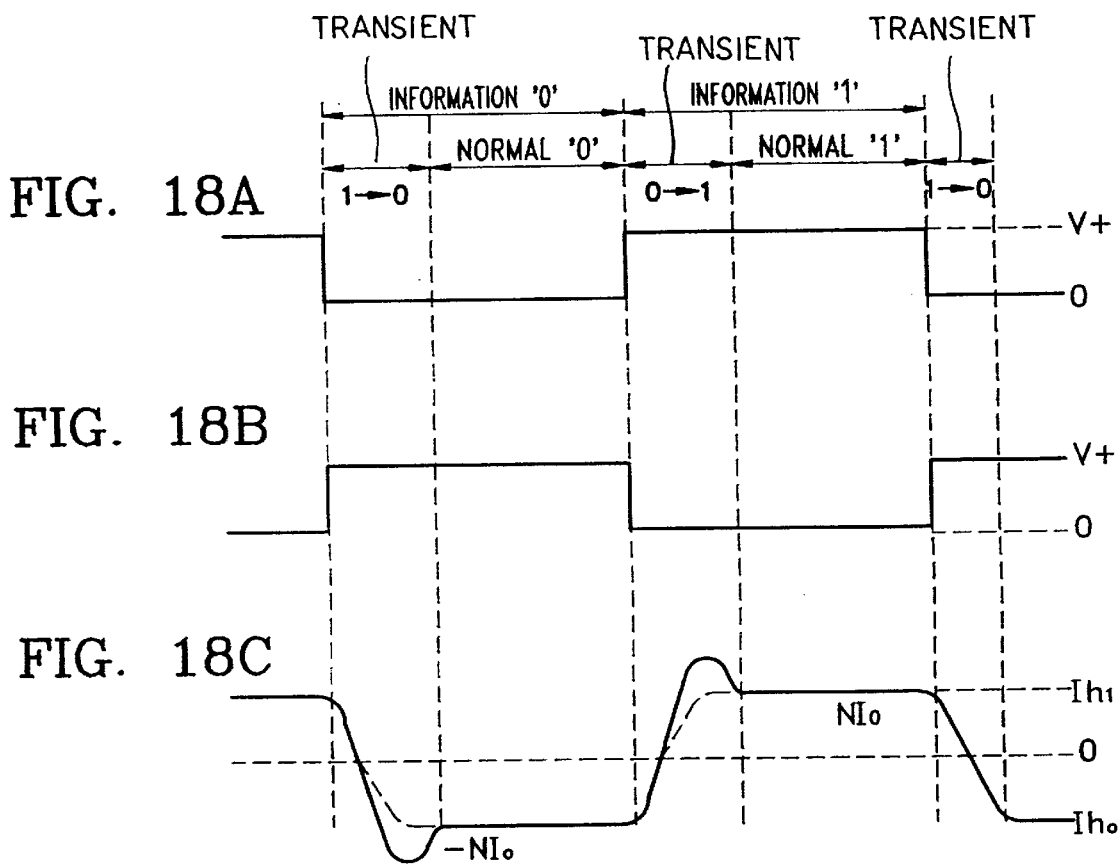

R/T OUTPUT

REC AMP INPUT

REC AMP OUTPUT (HEAD CURRENT)

CURRENT $I_s$ OF CONSTANT CURRET SOURCE

SYNTHESIZED EXCITING CURRET $I_{prt}$ OF P/T AND R/T

HEAD CURRENT $I_h$

HEAD LOSS CURRENT $I_{hr}$

HEAD EXCITING CURRENT $I_{hl}$ 6,867,334

MAGNETIC RECORDING DEVICE AND METHOD USING A PUSH-PULL AMPLIFIER STRUCTURE AND SHAPING DRIVER CIRCUIT

BACKGROUND OF THE INVENTION

The present invention relates to a magnetic recording device and method, and more particularly, to a magnetic recording device and method in which a magnetic head records audio and video information on a magnetic recording medium by using a low power-consuming recording amplifier suited for a high-speed and high-density recording.

Magnetic recording of information is accomplished by generating a magnetic flux by means of a head current flowing through a magnetic head and thus magnetizing a magnetic recording medium. Generally, a recording amplifier of a constant current source is used to supply a current of an intended signal waveform to a magnetic head having an inductive impedance. To obtain the intended current signal waveform, its corresponding voltage signal waveform should be generated in a signal processor, in advance.

FIG. 1 is a circuit diagram of a conventional A-class single-ended recording amplifier.

As shown in the figure, a current feedback resistor $R_k$ is connected to the emitter of an amplifying transistor $Q_a$. Applied to the base of the transistor $Q_a$ is an input voltage signal $E_i$ and a bias current $I_{bo}$ and a base current $I_{br}$ corresponding to the input voltage signal $E_i$ shown in FIG. 2A. The transistor $Q_a$ operates by this base current $I_{br}$. Therefore, a collector alternate current (AC) component $I_a$, i.e., a recording current $I_r$ shown in FIG. 2B, as well as a direct current (DC) component $Q_{ao}$ corresponding to the bias current $I_{bo}$ are supplied to the primary part of a rotary transformer (hereinafter referred to as R/T), and a head current $I_h$ shown in FIG. 2D flows in the secondary side of the R/T.

Meanwhile, when a binary coded recording current $I_r$, indicative of binary coded information, flows and is switched in an inductance load such as the magnetic head, a transient pulse voltage $V_{tr}$ shown in FIG. 2C is generated across the head, in this case at the collector of the transistor $Q_a$. To prevent the waveform of a collector voltage $V_a$ from being distorted, the transistor $Q_a$ should function as an A-class amplifier by assigning its operation quiescent point on a linear portion of its characteristic curve.

In the A-class recording amplifier shown in FIG. 1, $$E_i \approx I_a R_k, \text{ or } I_a/E_i \approx \text{constant} \quad (1)$$

The recording amplifier of FIG. 1 can be approximated to an equivalent circuit of FIG. 3, in which a head impedance $Z_h$ being an inductive impedance is generated by connecting in parallel with one another an equivalent inductor $L_h$, a loss resistor $R_h$, and an equivalent capacitor $C_h$. Assuming that an upper limit frequency of a transmission band is $f_m$ and the ratio of the number of windings at the primary side to that of windings at the secondary side of the R/T is N, $$R_h/(2\pi f_m L_h) \approx (3\sim 4) > 1 \quad (2)$$

Since the load of the transistor $Q_a$ of FIG. 1 is an inductive impedance, an output impedance $R_s$ of the transistor $Q_a$ should be larger than the head impedance $Z_h$ to flow the predetermined head current $I_h$.

$$R_s \gg |Z_h|, \text{ or } R_s \gg 2\pi f_m L_h \quad (3)$$

Given an amplification degree as A, the recording current $I_r$ output from the transistor $Q_a$ is calculated by $$I_r = A \cdot E_i/(R_s + Z_h) \approx A \cdot E_i/R_s \quad (4)$$

$$Z_h = R_h \cdot j2\pi L_h/(R_h + j2\pi L_h) \approx j2\pi L_h \quad (5)$$

Accordingly, a recording-equalization compensation can be performed in the linear amplifier of FIG. 1 for providing the head current $I_h$ proportional to the input voltage signal $E_i$.

In this case, with the upper limit frequency $f_m$ of an effective band, the condition such that $R_s > |Z_h|$ should be satisfied based on the premise that $$R_h > 2\pi f_m L_h \text{ and } 2\pi f_m < \sqrt{(L_h C_h)}.$$

FIG. 4 illustrates a B-class push-pull recording amplifier having a pulse transformer (hereinafter referred to as P/T), and FIG. 5 illustrates a B-class push-pull recording amplifier without the P/T.

In the B-class push-pull recording amplifier of FIG. 4, the collector of a transistor $Q_k$ having a current feedback emitter resistor $R_k$, for controlling a constant current, is connected to a common emitter of transistors $Q_a$ and $Q_a'$ exhibiting high-power impedance characteristics. Since the recording amplifier is a push-pull type, DC components can be cancelled and, practically, neglected at the primary side of the P/T.

Base currents $I_{br}$ and $I_{br}'$ generated by input voltage signals $E_i$ and $E_i'$ shown in FIGS. 6A and 6B are injected to the respective bases of the transistors $Q_a$ and $Q_a'$, thus alternately turning on and off the transistors $Q_a$ and $Q_a'$.

A predetermined recording current $I_a$ shown in FIG. 6C is transferred to the secondary side of the P/T and converted into a recording current $I_r$, when the transistor $Q_a$ is turned on by the base current $I_{br}$. A predetermined collector current $Q_a'$ shown in FIG. 6D is transferred to the secondary side of the P/T and converted into the recording current $I_r$, when the transistor $Q_a'$ is turned on by the base current $I_{br}'$. The recording current $I_r$ is supplied to a head H'D through the R/T and thus a head current $I_h$ shown in FIG. 6E flows through the head H'D. Here, switches for a recording/reproducing head are used as recording/reproducing switches REC/PB SW and REC/PB SW'.

On the other hand, as compared with the recording amplifier of FIG. 4, the recording amplifier of FIG. 5 has resistors $R_L$ and $R_L'$ as collector loads connected to the push-pull amplifiers $Q_a$ and $Q_a'$, respectively, thus omitting the P/T.

Recording equalization of the B-class push-pull recording amplifier will be described in more detail, with reference to FIG. 4.

An equivalent circuit of the recording amplifier shown in FIG. 4 is illustrated in FIG. 7A. Referring to FIG. 7A, when a head impedance $Z_h$ is measured in a small signal, the recording amplifier of FIG. 4 can be approximated by the equivalent circuit of FIG. 7A by connecting in parallel an equivalent loss resistor $R_h$, an inductor $L_h$ and a parasitic capacitor $C_h$, which are surrounded by a dotted block. The same equivalent circuit can be obtained in the case where a large current such as a recording current flows.

A current supplied through respective source output resistors $R_s$ by means of the input binary coded signal $E_i$ and its polarity-reverted signal $E_i'$, switched in the switches SW and SW', passes through the P/T and R/T, and reaches the magnetic head.

Here, the coupling coefficient of the P/T is nearly 1.00, and that of the R/T is about 0.94–0.98. Thus, the leakage inductance of the P/T is negligible. On the assumption that the leakage inductance of the R/T is $L_K$, inductances at the primary sides of the P/T and R/T are $L_{PT}$ and $L_{RT}$, respectively, a stray capacitance existing in an actual circuit is $C_s$, and the ratio of the number of turns of the stator (the primary side) and the rotator (the secondary side) of the R/T is N, the equivalent circuit of FIG. 7A can be simplified to a circuit of FIG. 7B.

The equivalent circuit of FIG. 7B can be further simplified to a circuit shown in FIG. 7C by a primary approximation based on practical conditions such that $$L_{RT} > N^2 L_h, C_s \gg C_h/N^2, L_{PT} > N^2 L_h, \text{ and } L_K < N^2 L_h.$$

A head exciting current $i_L$ flowing in the head inductor $L_h$ for producing a recording magnetic field can be obtained in a circuit of FIG. 7D which is equivalent to the circuit of FIG. 7C by substituting $C_s$, $N^2 L_h$, and $N^2 R_h$ for C, L, and R, respectively. A recording current $i_R$ can be approximated to $E_i/R_s$, as described above.

A current $i_C$ flowing through a total stray capacitor C at the primary side of the R/T is initially determined, and then a current $i_{RS}$ flowing through a loss resistor R of the magnetic head and a current $i_L$ flowing through an inductor L of the magnetic head are calculated.

As shown in FIG. 8A, a period $\tau$ of the $i_c$ waveform is defined as one cycle of a sine wave, and a voltage $V_p$ applied to the capacitor C is calculated by using the cycle $\tau$.

$$i_C = i_{CO} \cdot \sin(2\pi t/\tau) = C \cdot dV_p/dt \quad (6)$$

where $i_{CO}$ is a maximum value of $i_C$ and $$\tau = 2\pi \sqrt{(LC)} \ . \quad (7)$$

The current $i_{RS}$ of FIG. 8B flowing through the resistor R can be calculated by $$i_{RS} = V_p/R = \Box(i_C \cdot dt)/CR \quad (8)$$

The ratio of the maximum value $i_{RO}$ of the current $i_{RS}$ shown in FIG. 8B to the maximum value $i_{CO}$ of the current $i_C$ shown in FIG. 8A is given by $$i_{RO}/i_{CO} = \tau/\pi CR \quad (9)$$

The waveform of the current $i_L$ flowing through the inductor L is illustrated in FIG. 8C, and $$V_p = -L \cdot di_L/dt, \text{ thus}$$

$$i_L = -1/L \cdot \Box V_p dt \quad (10)$$

Therefore, to flow an intended current through the inductor L, it is necessary to supply both the current $i_C$ and the current $i_{RS}$ as the recording current $i_R$. Accordingly, $$i_R = i_L + i_C + i_{RS} \quad (11)$$

The ratio of the maximum value $i_{LO}$ of the current $i_L$ shown in FIG. 8C to the maximum value $i_{CO}$ of the current $i_C$ is expressed as $$i_{LO}/i_{CO} = \tau^2/(2\pi LC) \quad (12)$$

On the other hand, a stray parasitic capacitance on the recording/reproducing switches REC/PB SW and REC/PB SW' or on collector distributing capacitors $C_{SO}$ and $C_{SO}'$ exists in the recording amplifier of FIG. 4. If the switches SW and SW' are semiconductor devices, there exists an additional 10pF of stray capacitance, and the parasitic capacitance of a drum assembly is 10pF or above, including those of the R/T and a flat cable. However, the stray capacitance $C_S$ is generally considered to be approximately 20pF, in total. The sum $(i_L + i_C)$ of the currents $i_L$ and $i_C$ is illustrated in FIG. 8D.

Therefore, as the stray capacitance becomes larger, the rise characteristics (average rise time and $\tau$) of the head magnetizing current $i_L$ are degraded, as noted from equation (7). A dotted line in FIG. 8C indicates the waveform of the head magnetizing current $i_L$ exhibiting the degraded rise characteristics.

To obtain $i_L$ having the rise characteristic as indicated by a solid line in FIG. 8C, a charging and discharging current $i_c$ should be provided to a stray capacitor $C_s$, simultaneously. To achieve a current exhibiting a steeper rise characteristic curve shown in FIG. 8D, it is necessary to improve the rise characteristic of the input voltage signal $E_i$ in the recording amplifier.

Also, to improve the rise characteristic of $i_L$, the sum current $(i_L + i_{RS})$ showing a steeper rise characteristic curve than that of $i_L$ should be supplied as a head magnetizing current. The current $(i_L + i_{RS})$ is smaller than that of $i_L$ compensated for by $i_C$, i.e., a current $(i_L + i_C)$ shown in FIG. 8D. The waveform of the sum current is illustrated in FIG. 8E.

Therefore, to reduce the rise time of the head magnetizing current $i_L$ flowing through the inductor L, apertures of an input pulse should be corrected. Since recording equalization is possible by generating an input signal of the waveform shown in FIG. 8D in an extra recording equalizer and providing the signal to the recording amplifier, a bit error rate can be improved during playback of a digital signal. Thus, a recording equalization for reducing the rise time of the head current is required for a high-speed, and high-density recording.

Without this recording equalization, a part of the rising portion of the head magnetizing current $i_L$ is lost due to charge and discharge of the stray capacitance $C_S$, thus being ineffective in magnetizing. As a result, the rise time is increased and the rise characteristic of the current $i_L$ for magnetizing the magnetic tape is lowered, leading to degradation of a high-speed, and high-density recording performance.

FIGS. 9 and 10 illustrate recording amplifiers of a switching type, adopting constant current sources. FIG. 9 shows a single-ended recording amplifier and FIG. 10 shows a push-pull recording amplifier.

A transistor $Q_k$ in the single-ended recording amplifier of FIG. 9 has a current feedback resistor $R_k$ connected to the emitter thereof and thus controls a recording current $I_r$ to be constant. A transistor $Q_s$ functions as a switch for supplying or blocking the recording current $I_r$ according to an input binary coded pulse signal $E_i$.

If a resistance for the turned-on transistor $Q_s$ is $R_{ON}$, a resistance for the turned-off transistor $Q_s$ is $R_{OFF}$, and a constant current output impedance is $R_S$, an equivalent circuit of the recording amplifier shown in FIG. 9 can be obtained as shown in FIG. 11, and the following condition is satisfied in an actual circuit.

$$R_{ON} \ll R_S \gg R_{OFF} \quad (13)$$

Meanwhile, the waveform of a recording current $I_r$ is illustrated in FIG. 11B.

In FIG. 11B, a rise time constant $\tau_r$ and a rising current $I_{Rr}$ of $I_r$ are given by $$\tau_r = N^2 L_h / R_S \quad (14)$$

$$(R_S \ll R_{ON})$$

$$I_{Rr} = I_O\{1 - \exp(-t/\tau_r)\} \quad (15)$$

where $I_O \simeq E/R_S$.

$I_{Rr}$ at the start of rising (t ( $\tau_r$) is given as $$I_R = \frac{E}{R_S} \{1 - [1 - (R_s \cdot t)/N^2 L_h + (R_s \cdot t/(N^2 L_h)^2/2 - \ldots ]\}$$

$$= \frac{E}{(N^2 L_h)} \cdot t\{1 - (R_S/(N^2 L_h))/2 \cdot t + \ldots\}$$

Similarly, a fall time constant $I_f$ and a falling current $I_{Rf}$ of $I_r$ are expressed as $$\tau_f = N^2 L_h / R_{OFF} \quad (16)$$

$$(R_{OFF} \ll N^2 R_h)$$

$$I_{Rf} = I_O\{1 - \exp(-t/\tau_f)\} \quad (17)$$

$I_{Rf}$ at the start of falling (t ( $\tau_f$) is as follows:

$$I_{Rf} = E/(N^2 L_h) \cdot t\{1 - (R_{OFF}/(N^2 L_h))/2 \cdot t + \ldots\}$$

Here, ringings are produced by the stray capacitance $C_S$ and the head inductance $N^2 L_h$ in view of the collector capacitance $C_{SO}$ of the transistor $Q_s$ shown in FIG. 9. The cycle $\tau_{rg}$ of these ringings is given in the following equation:

$$\tau_{rg} = N\sqrt{(L_h C_S)} \quad (18)$$

As noted in equation (18), the resistance $N^2 R_h$ has no significant impact on the rise characteristic of the recording current $I_r$.

Therefore, since there is a large disparity between the rise time and the fall time, as shown in the current waveform of FIG. 11B, even-numbered high harmonics components are generated in the recording current, and the eye pattern of a reproduction signal is distorted, causing errors.

To prevent generation of these even-numbered high harmonics components, the push-pull recording amplifier of FIG. 10 should be used. An equivalent circuit of the recording amplifier shown in FIG. 10 is illustrated in FIG. 12A and the waveform of the recording current $I_r$ flowing through the head is illustrated in FIG. 12B.

As shown in FIG. 12B, the rise and fall time constants of the recording current $I_r$ are equal and given by $$\tau_r = \tau_f = N^2 L_h / R_s \quad (19)$$

Further, ringings of the total stray capacitance $C_s$ in view of the parasitic capacitance $C_s'$ between terminals of the P/T and the R/T and the collector capacities $C_{SO}$ and $C_{SO}'$ of the transistors $Q_s$ and $Q_s'$ of FIG. 10 are generated to be vertically symmetrical as shown in FIG. 12B.

To enable the head current $I_h$ and the recording current $I_r$ to rapidly rise, the head inductance $L_h$ of the time constants $\tau_r$ and $\tau_f$ of equation (19) should be small, or the output resistance $R_s$ of the constant current source should be large. The head inductance $L_h$ is related with signal reproducing characteristics and, generally, an optimum value is given as the head inductance $L_h$ in terms of a highly efficient playback.

If the output resistance $R_s$ of the constant current source is large, a ringing generation voltage becomes larger and a ringing attenuation becomes smaller, due to the stray capacitance $C_s$. That is, the larger $R_s$ becomes, the smaller the amplitude and the larger the frequency of the ringing. Thus, $R_s$ is limited to hundreds of ohms. If $R_s$ is 200Ω and the inductance $N^2 L_h$ at the primary of the R/T is 10 μH, $\tau^r = \tau_f = 50$ ns, not enough for a high-speed recording.

As described above, the prior art recording amplifiers described in connection with FIGS. 1–12 have the following drawbacks.

The A-class recording amplifier of FIG. 1 performs a recording equalization by using a recording equalizer for the input voltage signal $E_i$ received by the transistor $Q_a$ having a constant current control function. Thus, degradation of recording characteristics caused by the parasitic stray capacitance $C_S$ on a recording system can be compensated for, while to operate the linear amplifier, power dissipation is large, and a power transistor is required, entailing the need for a high power voltage. As a result, the recording amplifier can not be compact.

The recording amplifiers of FIGS. 4 and 5 also exhibit the problems of high power dissipation, the need for a power transistor, and inapplicability to a small power-consuming recording.

Therefore, the A- and B-class recording amplifiers can perform recording equalization yet require a linear amplifying function, consuming much power. They cannot satisfy the demands of small size and low-power consumption.

The recording amplifiers of a constant current switching type shown in FIGS. 9 and 10 need a constant current source transistor, not the switching transistors $Q_s$ and $Q_s'$, as a power transistor. Thus, the recording amplifiers can be small and low power-consuming. However, the input of a recording-equalized voltage signal to the switching transistors $Q_s$ and $Q_s'$ simply turns the circuits on and off, thus making recording equalization-induced improvement impossible. Further, to reduce the rise time of a recording current, a large band and a high impedance are required as the output characteristics of the constant current source transistor $Q_k$.

SUMMARY OF THE INVENTION

Accordingly, to overcome the above problems, it is an object of the invention to provide a magnetic recording device employing a recording amplifier for a high-speed, and high-density recording in which the rise characteristics of a recording current can be improved without an extra recording equalizer.

It is another object of the present invention to provide a magnetic recording device employing a recording amplifier for a high-speed, and high-density recording, which is small and low power-consuming.

It is still another object of the present invention to provide a magnetic recording device employing a recording amplifier in which a recording current having a constant instantaneous value flows, and a transient pulse current is generated during reversal of the polarity of the recording current to a magnetic head.

It is a further object of the present invention to provide a magnetic recording device which records a digital signal by a transient pulse current generated during reversal of the polarity of a recording current.

It is yet another object of the present invention to provide a magnetic recording device which records a digital signal by providing a recording current having a predetermined instantaneous value, and generating a transient pulse current during reversal of the polarity of the recording current to a magnetic head.

To achieve the above objects, there is provided a magnetic recording device for recording a digital signal by providing a recording current indicative of digital information to a magnetic head, comprising: a shaping driver for positive and negative signals whose polarities are reversed, corresponding to the digital information; push-pull means for generating a recording current corresponding to the positive and negative signals and generating a transient pulse current during reversal of the polarity of the recording current; and current switching means for switching a current flowing through the push-pull means in response to the positive and negative signals, wherein the digital signal is recorded on the magnetic recording medium on the basis of the transient pulse current.

BRIEF DESCRIPTION OF THE DRAWINGS

The above objects and advantages of the present invention will become more apparent by describing in detail preferred embodiments thereof with reference to the attached drawings in which:

FIG. 1 illustrates a conventional A-class recording amplifier; FIGS. 2A–2D illustrate the waveforms of a voltage and a current of each portion of the recording amplifier shown in FIG. 1;

FIG. 3 is an equivalent circuit diagram of the recording amplifier shown in FIG. 1;

FIGS. 6A–6E illustrate the waveforms of a voltage and a current of each portion of the recording amplifier shown in FIG. 4;

FIGS. 8A–8F illustrate the waveforms of a voltage and a current of each portion of the equivalent circuit shown in FIG. 7D;

FIGS. 18A–18c illustrate the waveforms of an input voltage signal and a head current supplied to the recording amplifier shown in FIG. 17;

DETAILED DESCRIPTION OF THE INVENTION

Preferred embodiments of a magnetic recording device according to the present invention will be described, referring to the attached drawings.

Figure 4:
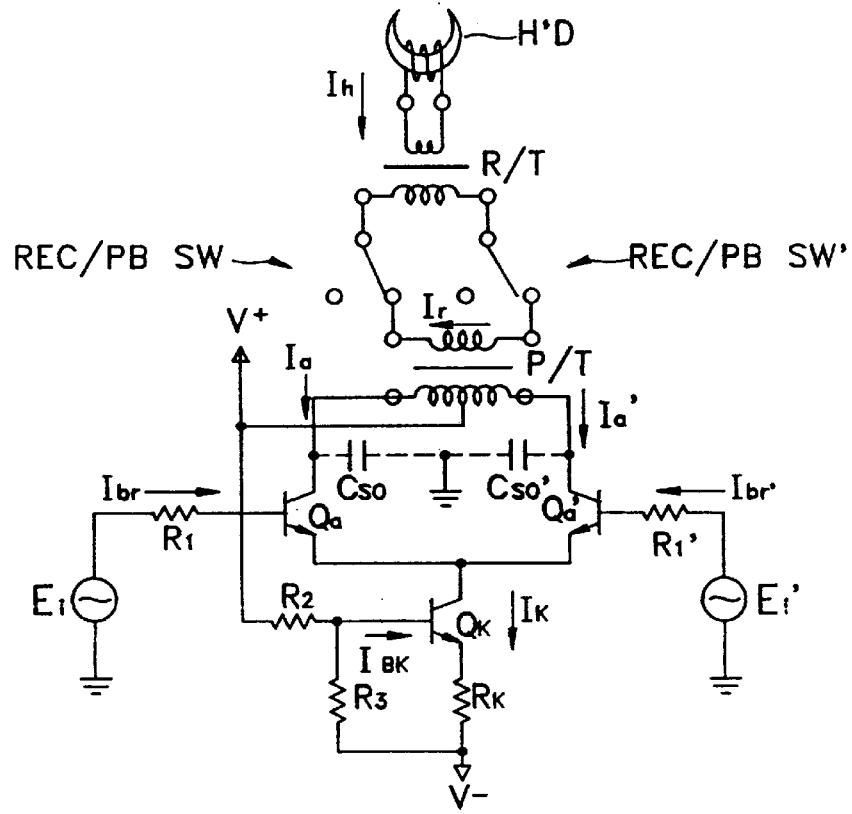
FIGS. 4 and 5 illustrate examples of a conventional B-class recording amplifier.
Figure 5:
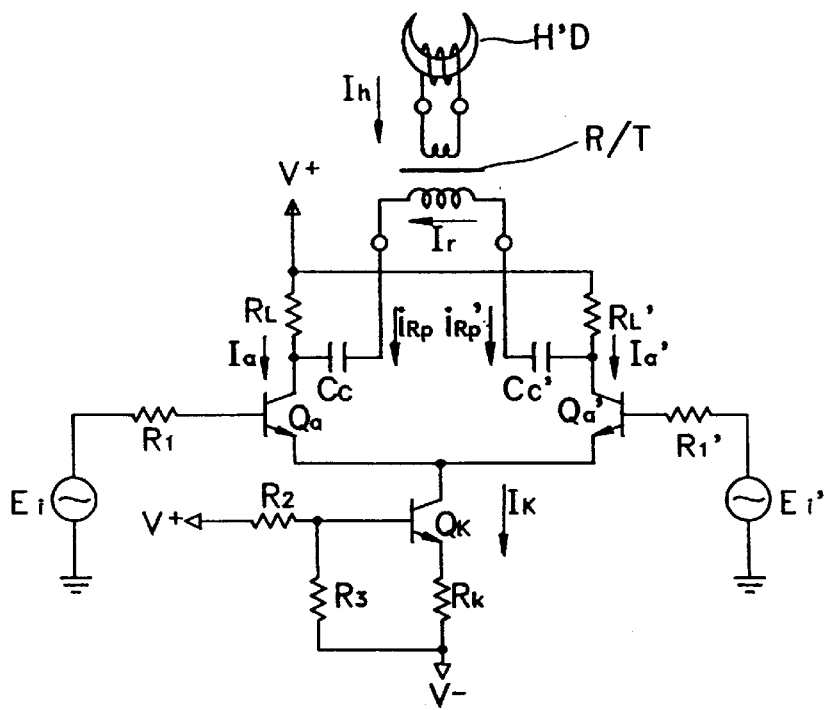
Figure 7A:
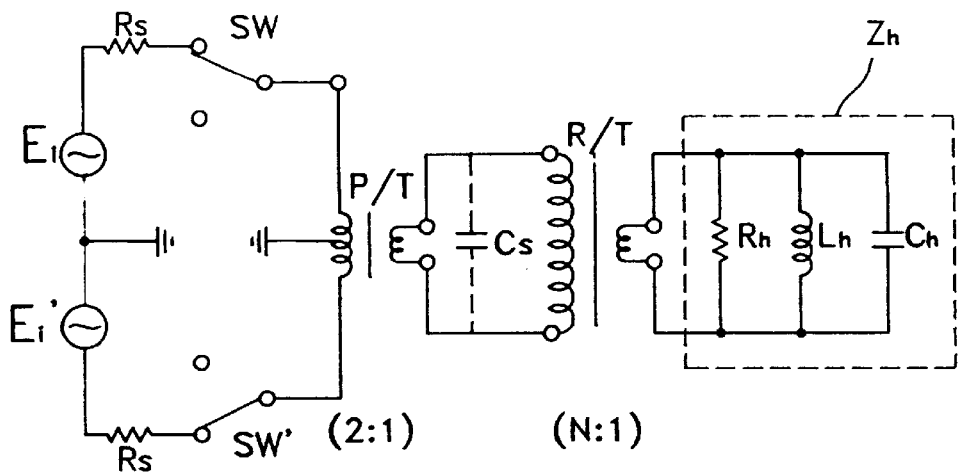
FIGS. 7A–7D are equivalent circuit diagrams of the recording amplifier shown in FIG. 4.
Figure 7B:
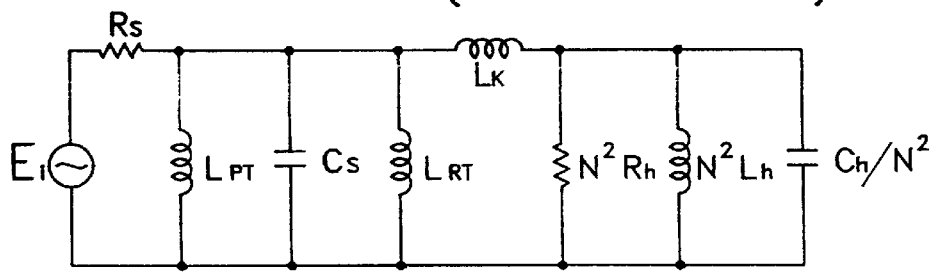
Figure 7C:
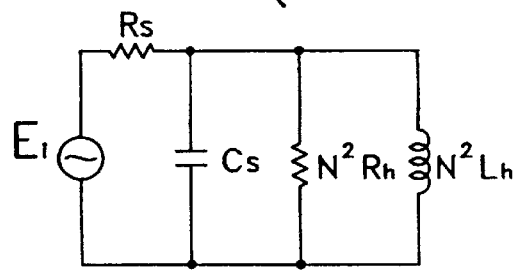
Figure 7D:
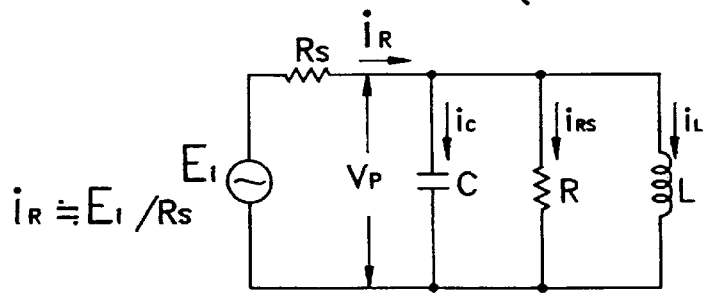
Figure 9:
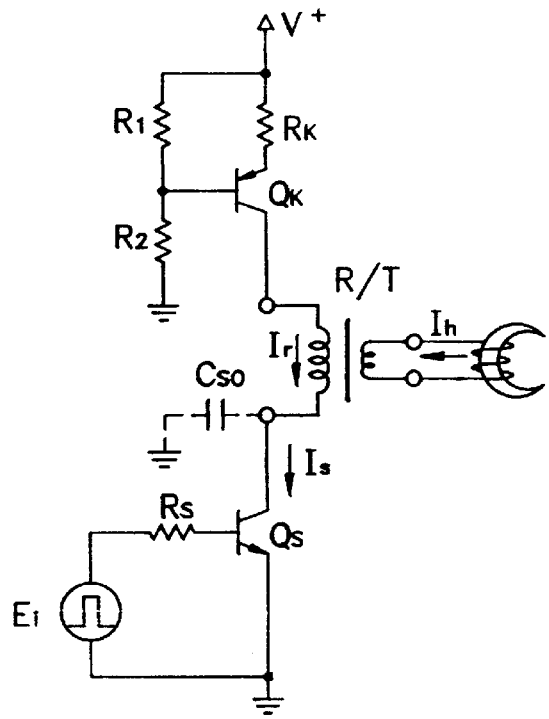
FIGS. 9 and 10 illustrate examples of a conventional recording amplifier of a switching type, for controlling a constant current.
Figure 10:
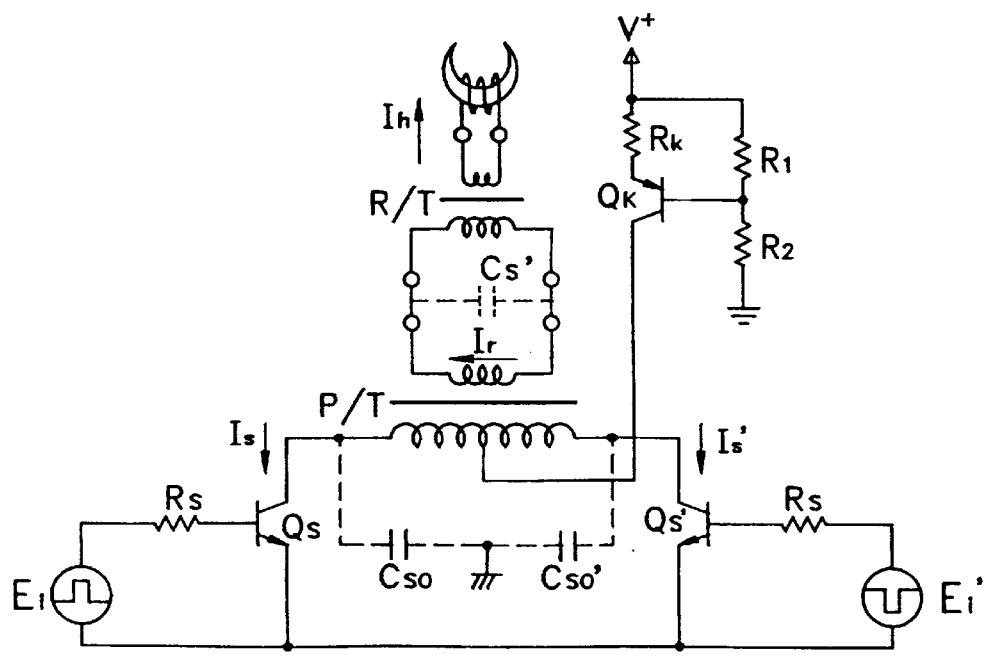
Figure 11B:
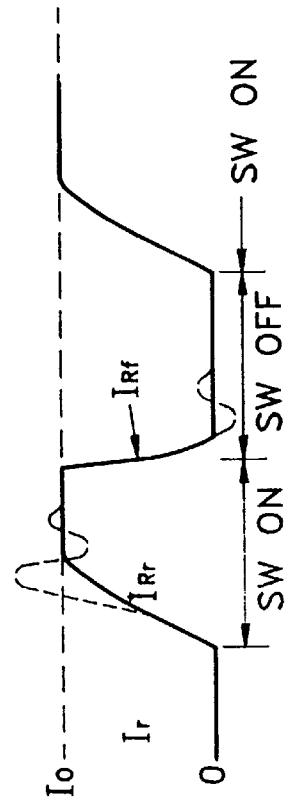
FIGS. 11A and 11B illustrate an equivalent circuit of the recording amplifier shown in FIG. 9 and the waveforms of a head current.
Figure 12B:
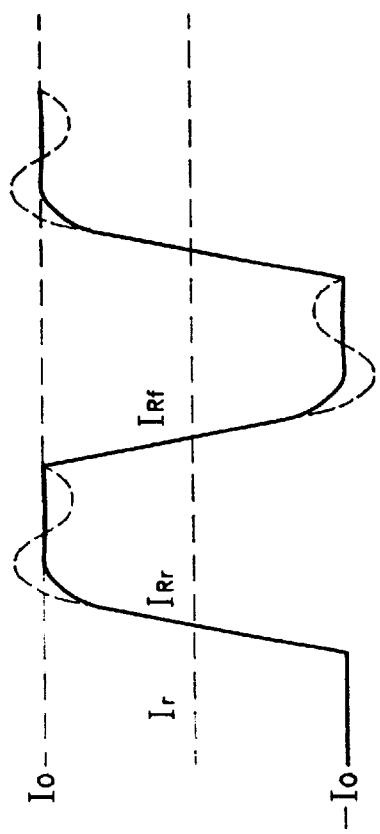
FIGS. 12A and 12B illustrate an equivalent circuit of the recording amplifier shown in FIG. 10 and the waveforms of a head current.
Figure 11A:
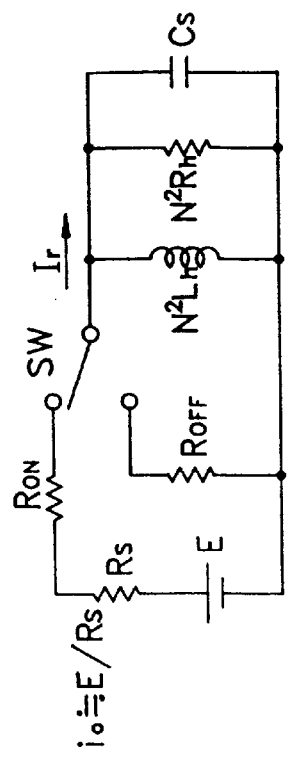
Figure 12A:
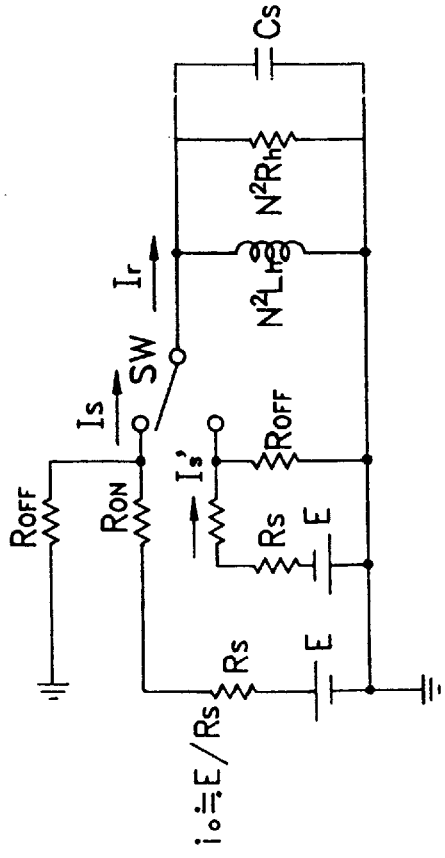
Figure 13:
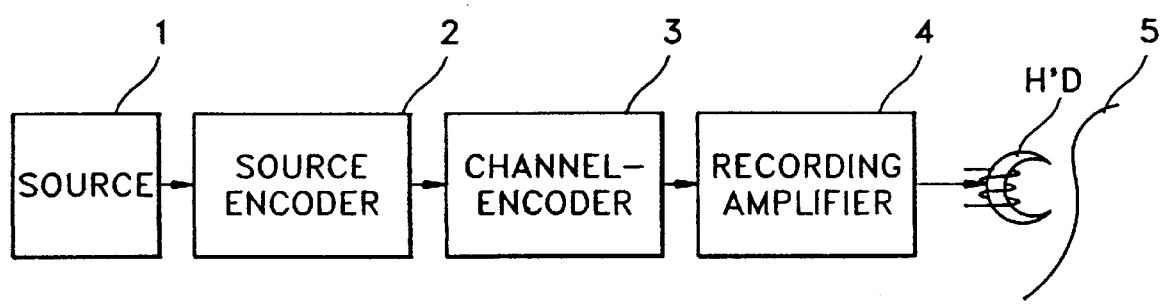
FIG. 13 is a schematic block diagram of a digital magnetic recording device applied to the present invention.

FIG. 13 is a schematic block diagram of a digital magnetic recording device according to the present invention.

Referring to FIG. 13, digital video and/or audio signals are output from a signal source 1. The source data is compressed in a source encoder 2 to remove the redundancy of the source data. A channel encoder 3 channel-encodes the compressed data to add the redundancy to the data unlike the source encoding and thus increase the robustness of the system against errors generated in the channel. This channel-encoding is referred to as modulation. A recording amplifier 4 converts the channel-encoded data into its corresponding current signal and provides a transient pulse signal having improved rise characteristics to a head H'D, to thereby magnetize a recording medium 5 and record the digital information.

Figure 14:
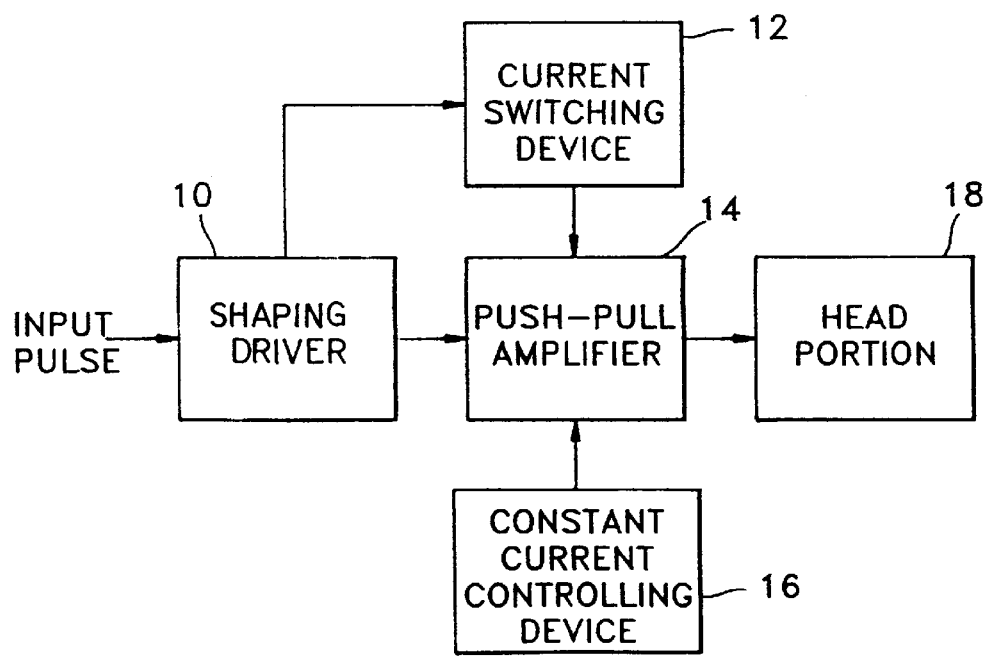
FIG. 14 is a detailed block diagram of an embodiment of the recording amplifier shown in FIG. 13.

FIG. 14 is a block diagram of a recording amplifier of a flyback switching type suggested in the present invention, according to an embodiment of the recording amplifier shown in FIG. 13.

In FIG. 14, the recording amplifier includes a shaping driver 10 for providing positive and negative signals corresponding to input pulses, a current switching device 12 for switching a recording current flowing through a push-pull amplifier 14, corresponding to the positive and negative signals output from the shaping driver 10, the push-pull amplifier 14 for receiving the positive and negative signals from the shaping driver 10 and supplying a reversed signal, whose rise characteristics are improved, at the moment when the polarity of the recording current is reversed, that is, a transient pulse current to a head portion 18, thereby increasing recording efficiency, and a constant current controlling device 16 for controlling a constant current to the push-pull amplifier 14.

Figure 15:
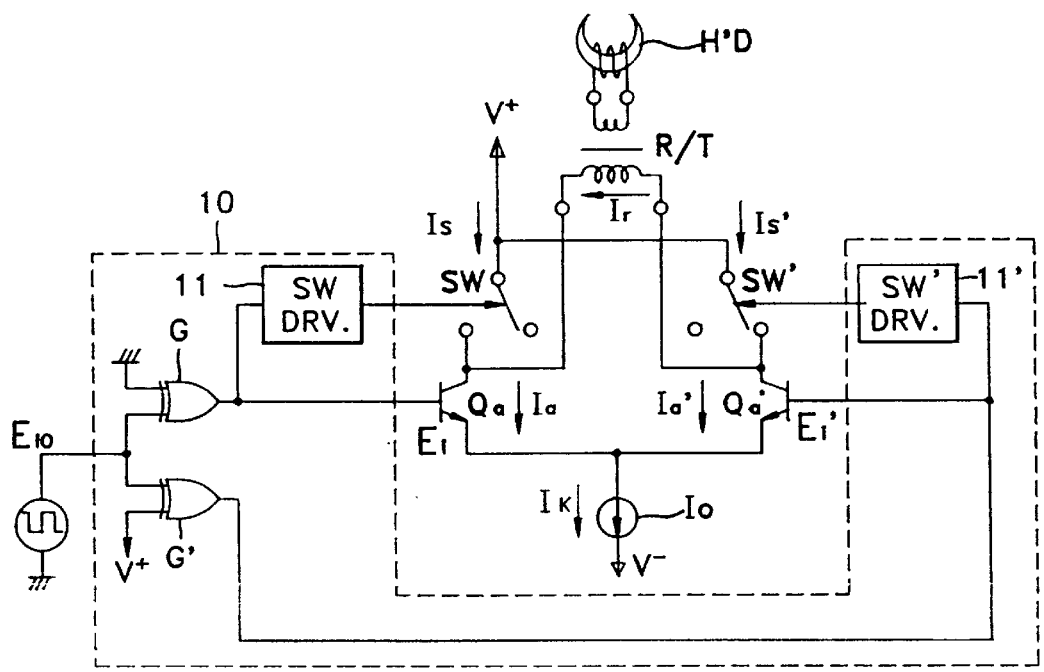
FIG. 15 is a diagram of the recording amplifier shown in FIG. 14, for explaining the principle thereof.

FIG. 15 is a circuit diagram of the recording amplifier shown in FIG. 14, for explaining the principle thereof. In the circuit, the polarity of the recording current is reversed by flyback and the switching speed of the recording current is simultaneously increased by using a phenomenon similar to latch-up causing problems in a C-MOS circuit.

Here, using the phenomenon similar to latch-up means that the absolute values of power supply voltages applied to DC voltage supply terminals V$^+$ and V$^-$ are determined as a minimum value required to maintain the function of a recording amplifier and current rise characteristics. In the present invention, a transient pulse current is generated when the recording current is reversed by properly adding this power supply voltage, and recording equalization is available by improving the rise characteristics of the transient pulse current, thereby enabling a high-density recording.

Referring to FIG. 15, a pair of components, i.e., a current switch SW and an amplifying transistor $Q_a$ connected to the switch SW, are connected in parallel to another pair of components, i.e., a current switch SW' and an amplifying transistor $Q_a'$ connected to the switch SW', thus forming a bridge. In this bridge, a switch operates simultaneously with a transistor diagonal to the switch.

Fixed terminals of the pair of switches SW and SW' are commonly connected to the DC voltage supply terminal V$^+$.

The respective collectors of the pair of transistors $Q_a$ and $Q_a'$ are connected to both ends of a primary side of an R/T connected to a head H'D, and the emitters of the transistors $Q_a$ and $Q_a'$ are commonly connected to a DC voltage supply terminal V$^-$ via a constant current source $I_o$.

The shaping driver 10 for generating a positive voltage signal Ei and a negative voltage signal $E_i'$ includes an exclusive OR gate G, an exclusive OR gate G', a switch driver 11 connected to an output port of the exclusive OR gate G, for controlling the switch SW, and a switch driver 11' connected to an output port of the exclusive OR gate G', for controlling the switch SW'. One input port of the exclusive OR gate G is grounded, the other input port thereof receives a driving pulse $E_{io}$, and the output port thereof is connected to the base of the transistor $Q_a$. One input port of the exclusive OR gate G' is connected to the DC voltage supply terminal V$^+$, the other input port thereof receives the driving pulse $E_{io}$, and the output port thereof is connected to the base of the transistor $Q_a'$.

One end of the constant current source $I_o$ is connected to the common emitter of the pair of transistors $Q_a$ and $Q_a'$, and the other end thereof is connected to the DC voltage supply terminal V$^-$.

Here, the exclusive OR gates G and G', and the switch drivers 11 and 11' correspond to the shaping driver 10, the pair of transistors $Q_a$ and $Q_a'$ correspond to the push-pull amplifier 14, the constant current source $I_o$ corresponds to the constant current controlling device 16, the head H'D and the R/T correspond to the head portion 18.

The operation of the recording amplifier will be described in connection with FIG. 15.

In FIG. 15, the shaping driver 10 surrounded by a dotted line receives the driving pulse $E_{io}$, and outputs the positive voltage signal $E_i$ and the negative voltage signal $E_i'$ via the exclusive OR gates G and G', respectively. The positive voltage signal $E_i$ is applied to the base of the transistor $Q_a$ and a collector current $I_a$ flows through the transistor $Q_a$. The negative voltage signal $E_i'$ is applied to the base of the transistor $Q_a'$ and a collector current $I_a'$ flows through the transistor $Q_a'$.

Simultaneously, the positive voltage signal $E_i$ and the negative voltage signal $E_i'$ output from the exclusive OR gates G and G' operate the current switches SW and SW' and control currents $I_s$ and $I_s'$ flowing through the switches SW and SW', respectively. A common emitter current $I_k$ of the transistors $Q_a$ and $Q_a'$ is the sum of the collector currents $I_a$ and $I_a'$.

Since the common emitter of the transistors $Q_a$ and $Q_a'$ is connected to the DC voltage supply terminal V$^-$ via the constant current source $I_o$, the peak-to-peak value of a recording current $I_r$ flowing through the primary side of the R/T is 2×$I_o$.

On the assumption that the current switches SW and SW' and the transistors $Q_a$ and $Q_a'$ perform a desirable switching operation, and a transient period when a current is switched is neglected, the waveforms of a current and a voltage in each portion of the recording amplifiers are illustrated in FIGS. 16A–16G.

Figure 16A:
FIGS. 16A–16G illustrate the waveforms of a voltage and a current of each portion of the recording amplifier shown in FIG. 15.
Figure 16B:
Figure 16C:
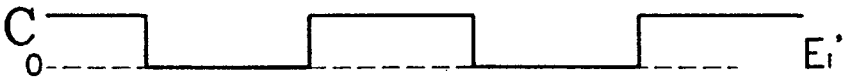
Figure 16D:
Figure 16E:
Figure 16F:
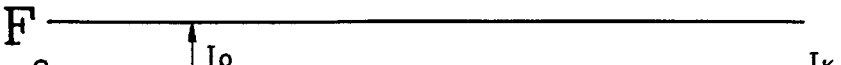
Figure 16G:
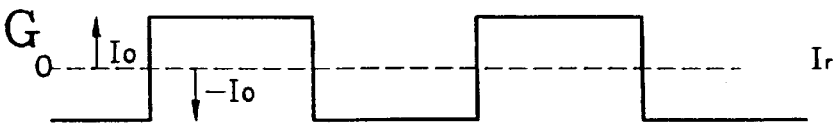

FIG. 16A illustrates the waveform of the driving pulse $E_{io}$, FIG. 16B illustrates the waveform of the positive voltage signal $E_i$, FIG. 16C illustrates the waveform of the negative voltage signal $E_i'$, FIG. 16D illustrates the waveforms of the current $I_s'$ flowing in the current switch SW' and the current $I_a$ flowing in the transistor $Q_a$, FIG. 16E illustrates the waveforms of the current $I_s$ flowing in the current switch SW and the current $I_a'$ flowing in the transistor $Q_a'$, FIG. 16F illustrates the common emitter current $I_k$ of the transistors $Q_a$ and $Q_a'$, and FIG. 16G illustrates the recording current $I_r$ flowing through the R/T.

Figure 17:
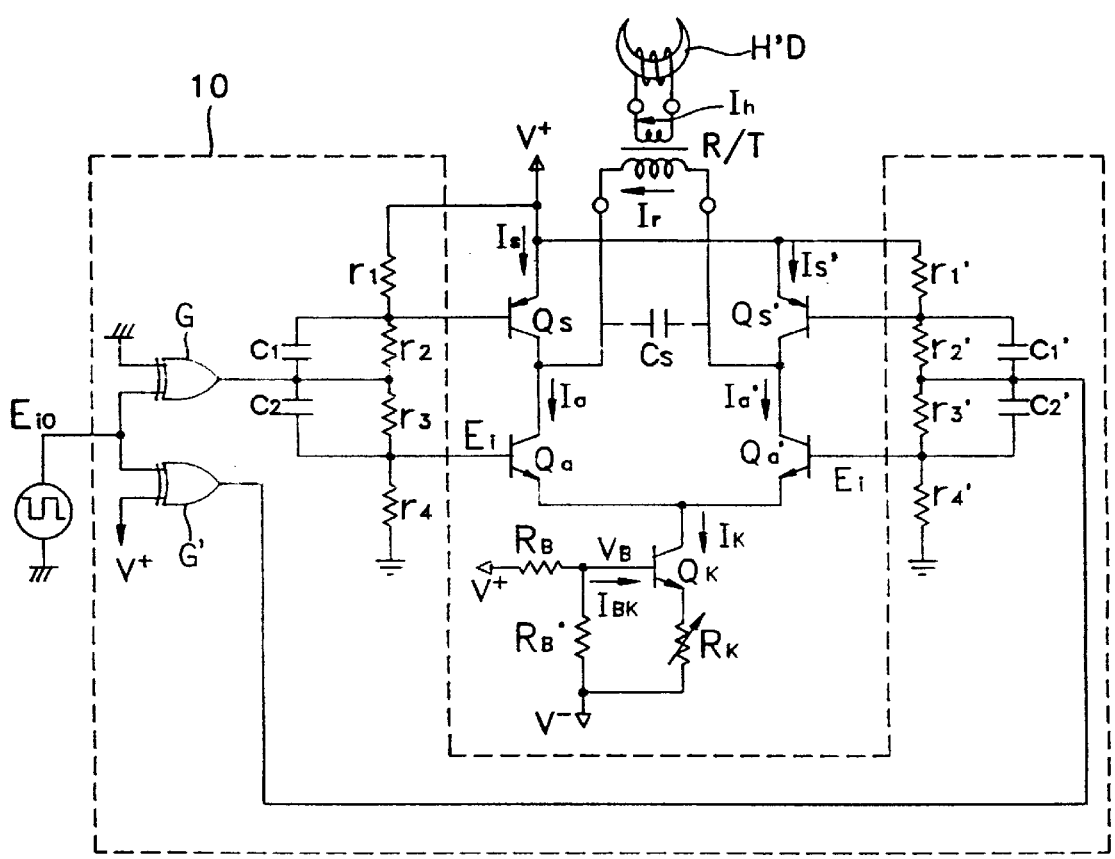
FIG. 17 is a detailed circuit diagram of the recording amplifier shown in FIG. 15.

FIG. 17 illustrates a circuit in which the current switches SW and SW' of FIG. 15 are replaced with transistors $Q_s$ and $Q_s'$. In the circuit, the transistors $Q_s$ and $Q_s'$ and the transistors $Q_a$ and $Q_a'$ are simultaneously driven by a high-speed logic circuit for a general purpose.

In FIG. 17, an npn transistor is used as the amplifying transistor $Q_a$ of FIG, 15, a pnp transistor $Q_s$ complementary to the transistor $Q_a$ serves as the current switch SW, and the transistors $Q_a$ and $Q_s$ are simultaneously driven by the voltage signal $E_i$. A current switching transistor $Q_s'$ and the amplifying transistor $Q_a'$ being counterparts of the transistors $Q_s$ and $Q_a$, respectively, are simultaneously controlled by the voltage signal $E_i'$ having a polarity opposite to that of $E_i$.

The transistor $Q_a$ is complementary to the transistor $Q_s$, while the transistors $Q_a'$ is complementary to the transistor $Q_s'$.

An end of a resistor $r_2$ serially connected to a resistor $r_1$ having one end connected to the DC voltage supply terminal $V^+$, and an end of a peaking capacitor $C_1$ connected to the resistor $r_2$ in parallel are commonly connected to the base of the transistor $Q_a$, while the other ends of the resistor $r_2$ and the peaking capacitor $C_2$ are connected to the output port of the exclusive OR gate G.

An end of a resistor $r_3$ serially connected to a resistor $r_4$ having a grounded end, and an end of a peaking capacitor $C_2$ connected to the resistor $r_3$ in parallel are connected to the base of the transistor $Q_a$, While the other ends of the resistor $r_3$ and the peaking capacitor $C_2$ are connected to the output port of the exclusive OR gate G.

Resistors $r_1'$–$r_3'$ and peaking capacitors $C_1'$ and $C_2'$ connected to the bases of the transistors $Q_s'$ and $Q_a'$ are arranged symmetrically with the resistors $r_1$–$r_3$ and the peaking capacitors $C_1$ and $C_2$.

On the other hand, the constant current controlling device 16 has a current feedback npn transistor $Q_K$. The collector of the transistor $Q_K$ is connected to the common emitter of the pair of transistors $Q_a$ and $Q_a'$, the emitter thereof is connected to the DC voltage supply terminal $V^-$ via the current feedback resistor $R_K$, and the base thereof is connected to the DC voltage supply terminal $V^+$. The ends of resistors $R_B$ and $R_B'$ for controlling a base current $I_{BK}$ are commonly connected to the base of the transistor $Q_K$, and the other ends thereof are connected to the DC voltage supply terminals $V^+$ and $V^-$, respectively.

The base current $IB_K$ of a predetermined value is injected to the base of the npn transistor $Q_K$ for controlling a constant current. In order to effect a full constant current control, the current feedback resistor $R_K$ is connected to the emitter of the constant current controlling transistor $Q_K$ and a resistance feedback is performed. The collector current $I_K$ of the transistor $Q_K$ can be controlled by varying the value of the resistor $R_K$. Thus, the saturation of the collector currents of the transistors $Q_a$ and $Q_a'$ can be controlled at predetermined values, since the common emitter of the amplifying transistors $Q_a$ and $Q_a'$ are connected to the collector of the constant current controlling transistor $Q_K$.

In practice, a problem arises from a transient period when a current polarity is reversed in the circuit for supplying the recording current to the magnetic head, as shown in FIGS. 18A–18C. A shorter transient period is better for a high-speed, and high-density recording.

FIG. 18A illustrates the waveform of the signal $E_i$ supplied from the shaping driver according to digital information, FIG. 18B illustrates the signal $E_i'$ having a polarity opposite to that of the signal $E_i$, and FIG. 18C illustrates the waveform of the recording current $I_r$ corresponding to these signals $E_i$ and $E_i'$.

Figure 19A:
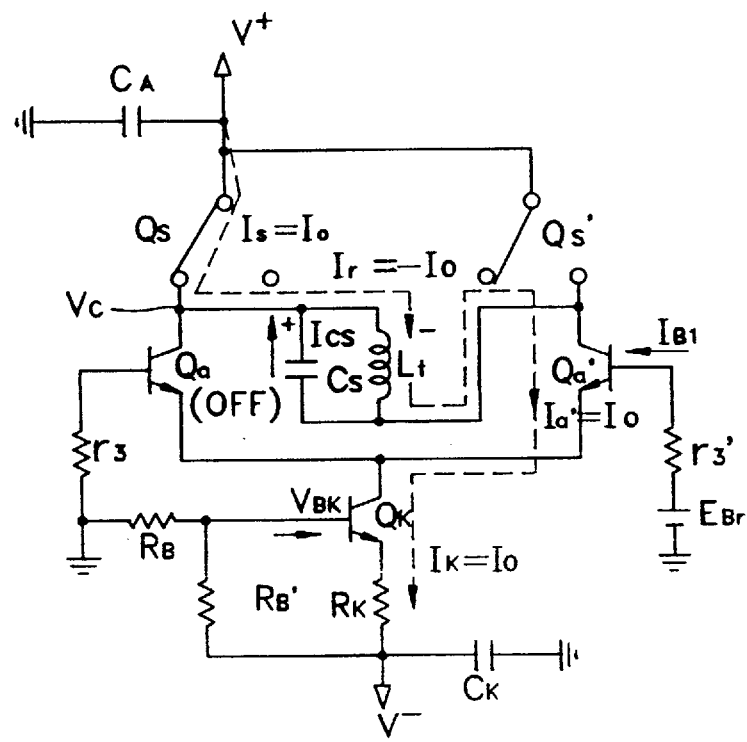
FIG. 19A is a circuit diagram of a flyback recording amplifier prior to switching for current polarity reversal.
Figure 19B:
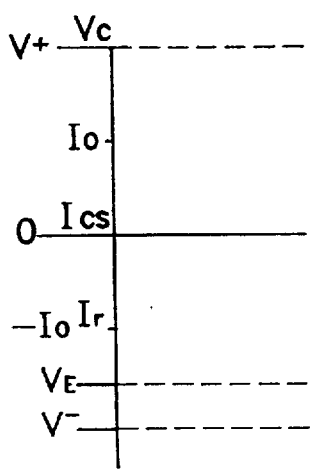
FIG. 19B illustrates the initial values of a voltage and a current in each portion under t=0.

FIG. 19A is a circuit diagram of the flyback recording amplifier, showing the initial values of a voltage and a current in each portion prior to switching for a current polarity reversal, and FIG. 19B illustrates the initial conditions of a voltage and a current in each portion under an initial state of t=0. In FIG. 19A, the transistors $Q_s$ and $Q_s'$ are shown in the form of switches.

Under an initial condition of t ( 0 shown in FIG. 19A, $Q_s$=ON, $Q_s'$=OFF, $Q_a$=OFF, and $Q_a'$=ON. Thus, the current $I_o$ flows in the order of $V(+) \rightarrow Q_s(I_s) \rightarrow L_t(-I_r) \rightarrow Q_a'(I_a') \rightarrow Q_k (I_k) \rightarrow V(-)$ according to the definition of a current flowing each portion.

Figure 20A:
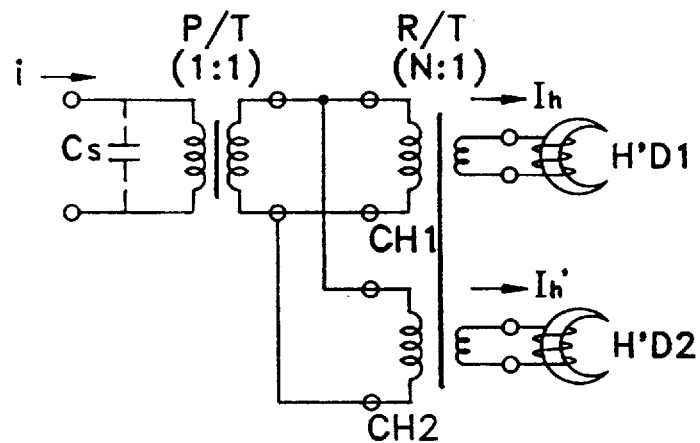
FIGS. 20a and 20B are diagrams for explaining a load impedance of a head portion and an equivalent circuit.
Figure 20B:
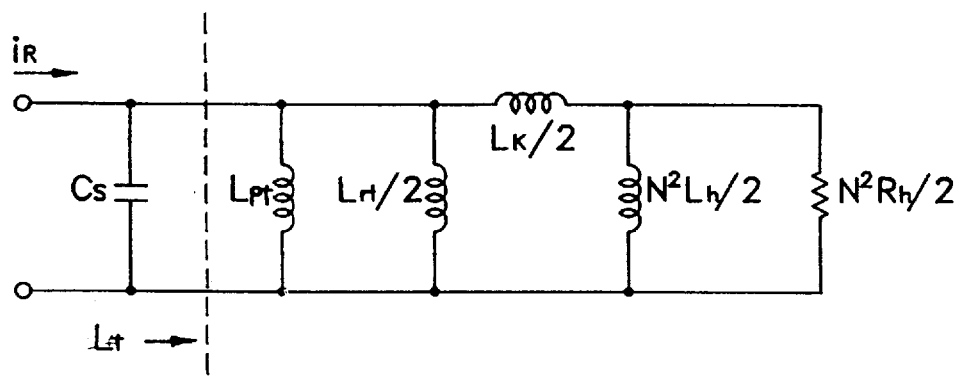

Here, $L_t$ is an inductance viewed from the primary side of the R/T toward the head, as shown in FIG. 20B, and more correctly, a complex inductance since it includes a resistance component $N^2R_h/2$.

FIG. 20A illustrates an example of a head portion having one P/T, one R/T, a two-channel transmission paths, and a recording/reproducing head for each channel. A variation can be made by omitting the P/T.

To reduce the rise time of a transient pulse signal generated during a transient period, it is necessary to consider inductances at the primary sides of the P/T and R/T.

Figure 21A:
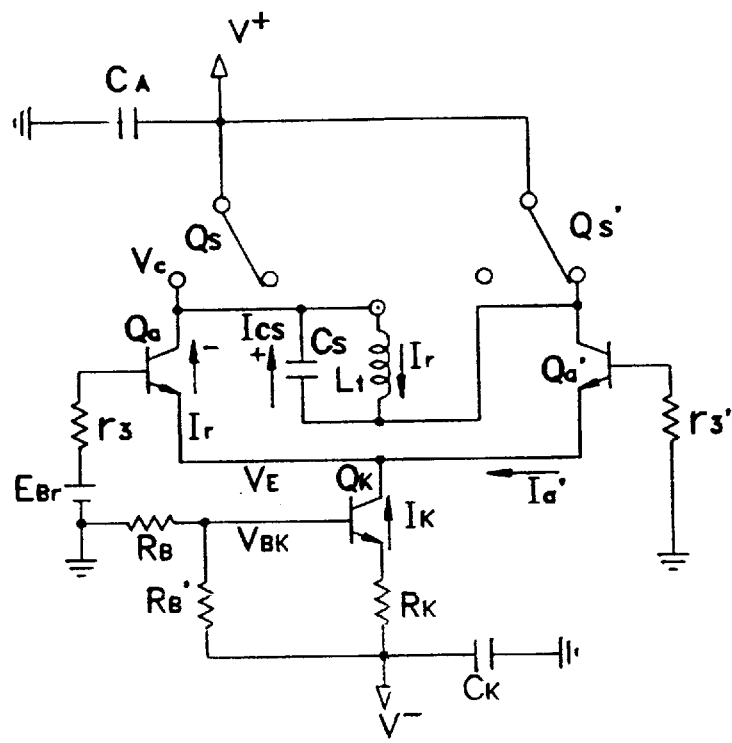
FIG. 21A is a circuit diagram for explaining a transient phenomenon prior to switching for current polarity reversal in the flyback recording amplifier.

FIG. 21A illustrates the procedure for reversing the recording current $I_r$ flowing through an inductor $L_t$ during a transient period of $0 \leq t \leq t_2$.

Here, as shown in FIG. 21A, $Q_s$=OFF, $Q_s'$=ON, $Q_a$=ON, and $Q_a'$=OFF.

Even if the transistor $Q_s$ is off, the recording current $I_r=I_o$ alternates between on and off according to inductance characteristics, not being immediately off. In this case, the current $I_r$ is supplied to the inductance by means of a current $I_{CS}$ discharged from a parallel stray capacitance $C_s$ parasitic on the inductor $L_t$.

Due to this discharge, voltages at both ends of the stray capacitor $C_s$, that is, a collector voltage $V_c$ of the transistor $Q_a$ eventually falls rapidly. Additionally, since a charge voltage $V_{ct}$ of $L_t$=the charge voltage $V_{cs}$ of $C_s \approx 0$ in a steady state of t(0, there is, if ever, little charges in the stray capacitor $C_s$. Hence, a current charged in $L_t$ is discharged to $C_s$ and a current is negatively charged in $C_s$. Here, since $C_s$ is charged, the voltage $V_{cs}$ at both ends thereof becomes drastically large. As a result, a voltage at the (+) terminal of $L_t$ is lower than the collector voltage $V_c$ of the transistor $Q_a$.

If time required for the current flowing in $L_t$ to reach $I_r=I_o=0$ is $\tau$ and the maximum degree by which the collector voltage $V_c$ falls is $\Delta V_{cm}$, and resistance components included in $L_t$ is neglected, the following relationships are established from the principle of the conservation of energy:

$$L_t \cdot (I_o)^2 = C_s(\Delta V_{cm})^2 \qquad (20)$$

$$\tau = (\pi/2) \cdot \sqrt{(L_t C_s)} \qquad (21)$$

In a case of $|V(+)-V(-)| < \Delta V_{cm}$, the collectors and bases of the transistors $Q_a$ and $Q_k$ are reverse biased before $V_c$ falls by $\Delta V_{cm}$, and $V_c$ reaches $V_{co}$ (t=t_1), thereby shorting the collectors from the emitters of the transistors $Q_a$ and $Q_k$. As a result, a current supply path is formed to lead to $L_t$, the current $I_{cs}$ is discharged from $C_s$, and thus, a current is supplied to $L_t$ by the reversed current $-I_r$ and $-I_k$ flowing through the transistors $Q_a$ and $Q_k$.

Therefore, the discharge current $I_{cs}$ of $C_s$ and the voltage of $V_c$ are rapidly decreased.

Figure 21B:
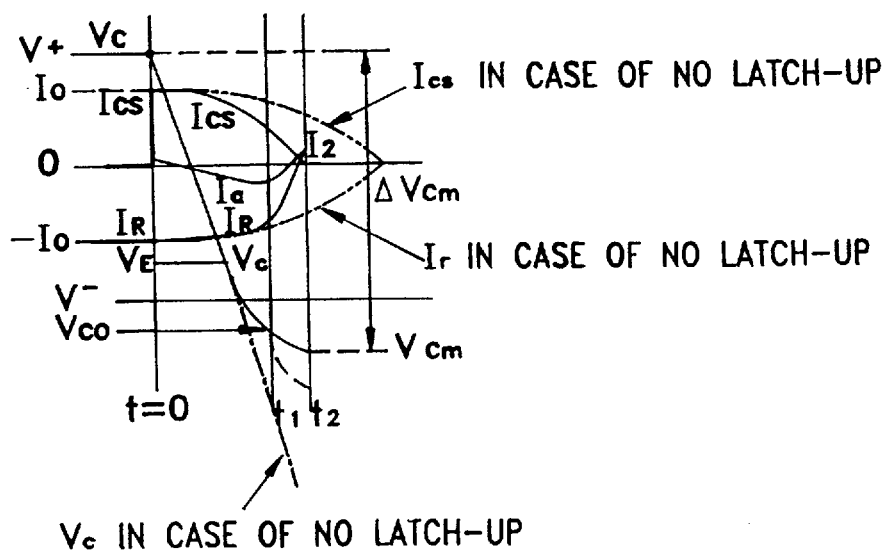
FIG. 21B illustrates the waveforms of a voltage and a current for FIG. 21A.

Then, in a case of t=t2, $V_c$ becomes its minimum voltage, that is, falls by the maximum degree $\Delta V_{cm}$, the discharge current $I_{cs}$ is 0. Though it can be thought that the current $I_a'$ flowing through the transistor $Q_a'$ is also supplied to $L_t$, a little delay in turning off the transistor $Q_a'$ blocks the flow of the collector current $I_a'$. The waveforms of the above-described voltages and currents in the respective portions of the recording amplifier are illustrated in FIG. 21B.

Figure 22A:
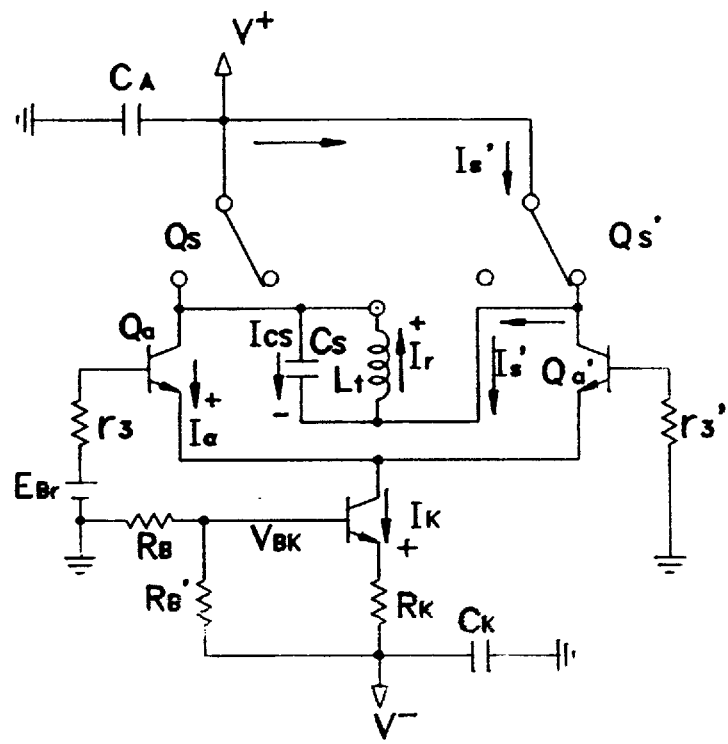
FIG. 22A is a circuit diagram for explaining a transient phenomenon after switching for current polarity reversal in the flyback recording amplifier.
Figure 22B:
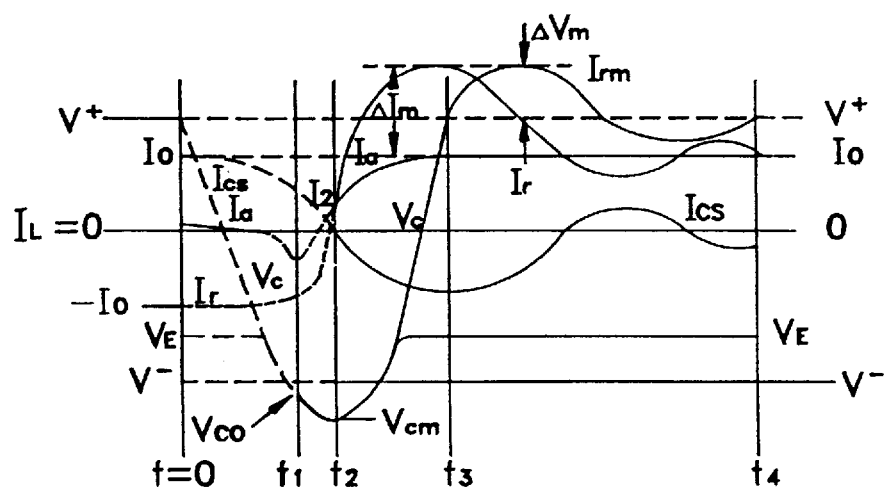
FIG. 22B illustrates the waveforms of a voltage and a current for FIG. 22A.

FIGS. 22A and 22B are views for explaining a transient phenomenon after switching for a current polarity reversal in the recording amplifier, showing the process of the reversal of the recording current $I_r$ during $t_2 \leq t \leq t_4$. In t=$t_2$, $I_r$ has already been reversed ($I_r$)0 and $I_a$) 0), but the collectors and emitters of the transistors $Q_a$ and $Q_k$ remain shorted for a carrier accumulation time unique to the transistors, due to excess carriers accumulated in the bases thereof. Therefore, a $V^+$ potential is applied to an end of the winding $L_t$ at the primary side of the R/T via the transistor $Q_s'$, and a $V^-$ potential is applied to the other end thereof. Here, since $L_t$ is a low impedance, the collector current $I_a$ is rapidly increased and the charge current $I_{cs}$ of the stray capacitor Cs is added to the collector current $I_a$, simultaneously, thereby rapidly increasing the recording current $I_r$.

As a result, though the collector voltage $V_c$ of $Q_a$ generates an overshoot by $\Delta V_{cm}$, as shown in FIG. 22B, it converges into a normal value $V^+$. On the other hand, in $t=t_3$, the recording current $I_r$ is overshot by $\Delta I_{rm}$ due to the current $I_o$ of a normal value, but converges into $I_o$, immediately. Here, $\Delta I_{rm}$ is the dose of current provided by the collector current $I_a$ of $Q_a$. Thus, the transient state is over, in which the polarity of the recording current is reversed by a phenomenon similar to latch-up.

Figure 23A:
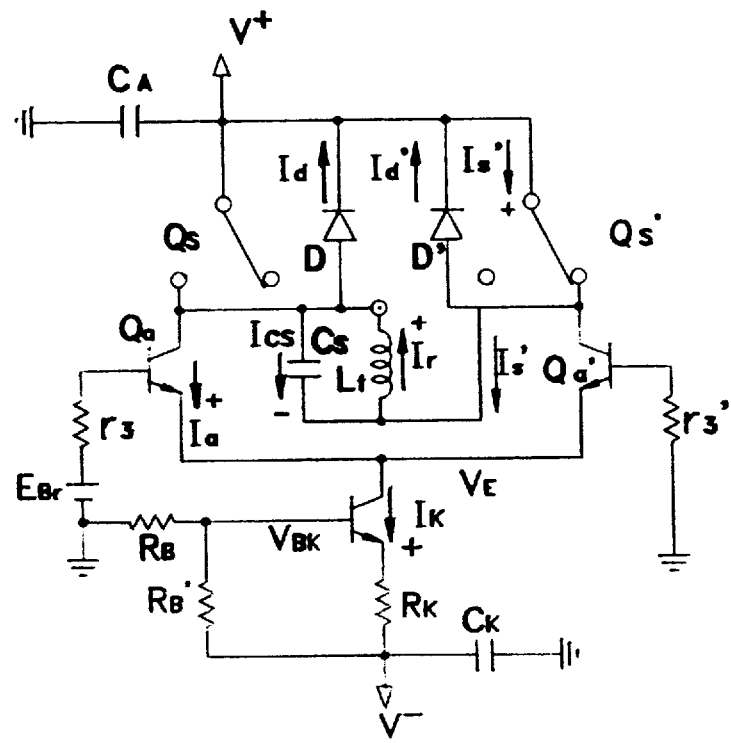
FIG. 23A is a circuit diagram showing variations in a voltage and a current of each circuit portion when a pair of dampers are provided to the circuit of FIG. 22A.

As shown in FIG. 23A, the overshoot of respective collector voltages $V_c$ and $V_c'$ can be prevented by inserting damper diodes D and D' between the respective collectors of the transistors $Q_a$ and $Q_a'$ and the DC voltage supply terminal $V^+$. Diode currents $I_d$ and $I_d'$ flow through the damper diodes D and D', respectively. Hence, the variations of a voltage and a current in each portion under ($t \leq t_3$), which are illustrated in FIG. 23B, are different from those shown in FIG. 22B.

Figure 23B:
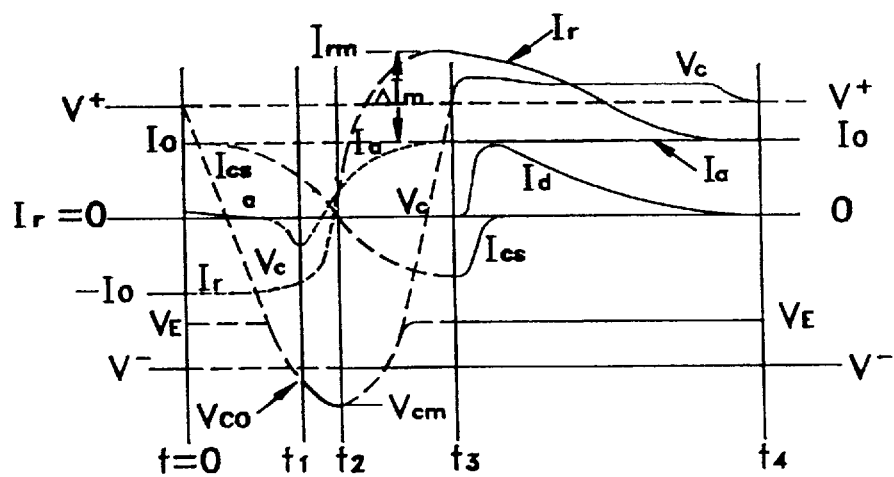
FIG. 23B illustrates the waveforms of a voltage and a current for FIG. 23A.

As shown in FIG. 23B, since the recording current $I_r$ is divided into the diode current $I_d$, the recording current $I_r$ converges into the current $I_o$ of a normal value.

As described above, since an amplifier for recording equalization should be provided with a linear amplifying function, a power transistor showing a large power dissipation is required. Thus, it cannot meet the demands of small-size and low-power. On the other hand, a recording amplifier employing a switching transistor exhibits the advantages of low power dissipation and small-size, while it is difficult to perform recording equalization for improvement of the rise characteristics of a recording current. As a result, this amplifier is not suited for high-speed, and high-density recording, either. A recording amplifier of a flyback switching type suggested in the present invention, which relies on a phenomenon similar to latch-up, can improve the rise characteristics of a recording current without recording equalization. Thus, it can be small and operate with a low power.

The three types of recording amplifiers are compared in Table 1.

TABLE 1

| type of recording amplifier | recording characteristic improvement | circuit for characteristic improvement | transistor for recording amplifier | power consumption (supply power) | circuit size for recording amplifier |
|---|---|---|---|---|---|
| constant current source linear amplification | recording equalization possible | recording amplifier | power amplification: large | large (±12 V) | large |
| constant current source switching | difficult | | SW: small constant current source: medium | medium: constant current source (10 V) | medium |

TABLE 1-continued

| type of recording amplifier | recording characteristic improvement | circuit for characteristic improvement | transistor for recording amplifier | power consumption (supply power) | circuit size for recording amplifier |
|---|---|---|---|---|---|
| flyback switching | latch-up similar mode | unnecessary | SW: small constant current source: small | small (5 V) | small |

However, the recording amplifiers of the above flyback switching type have a common problem when binary coded information (hereinafter referred to as a digital signal) including DC components is magnetically recorded.

As shown in FIG. 20A, when the current $I_r$ for recording the digital signal, including DC components, flows through the magnetic head mounted on the rotational cylinder, the magnetic head current $I_h$ passes through the R/T and P/T. Thus, the recording current $I_r$ is decreased due to lack of the DC components and fine magnetizing is performed. The problem is a variation in the instantaneous value of the head current is $I_h$ flowing through the head portion shown in FIG. 20A although, the P/T is not always needed.

Figure 24A:
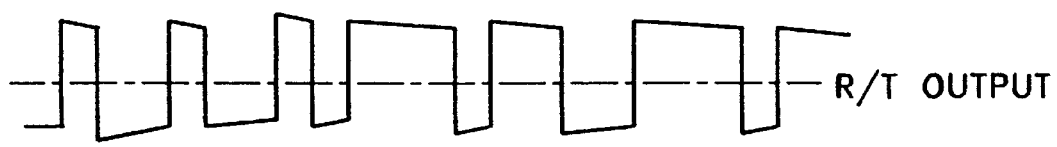
FIGS. 24A–24C illustrate the waveforms of input and output of a recording amplifier loaded inside a rotational cylinder.
Figure 24B:
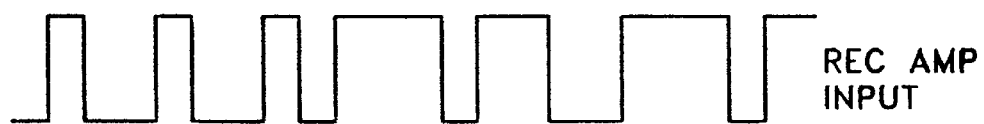
Figure 24C:
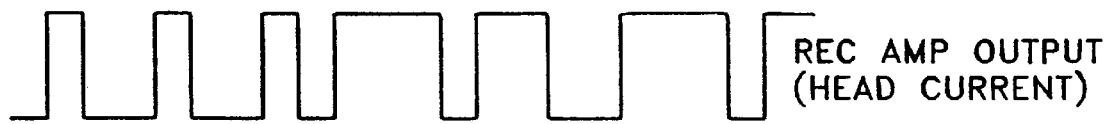

As a way to circumvent the above problem, a digital signal shape processing circuit and a recording amplifier can be provided in the rotational cylinder. As shown in FIGS. 24A–24C, a digital signal (see FIG. 24A) distorted due to the passage through the R/T and P/T and the resulting lack of the DC components is corrected in the digital signal shape circuit (not shown). The signal (see FIG. 24B) having the original restored DC components is input to the recording amplifier (not shown), and a magnetic head driving current (see FIG. 24C) corresponding to this signal is provided. The problem inherent in this method is that provision of the digital signal shape circuit for processing signal waveforms and, especially, the recording amplifier in the rotational cylinder increases structure complexity, which in turn leads to an increase in cost. In particular, the provision of a DC power source in the rotational cylinder causes many problems including reliability concerns.

The distortion of the digital signal caused by lack of the recording current DC components resulting from the passage via the R/T effects the prevention of a large magnetization of the head. However, the distortion varies the instantaneous value at the rise of the recording current.

The variation of the instantaneous value at the rise of the recording current will be described in detail.

Figure 25:
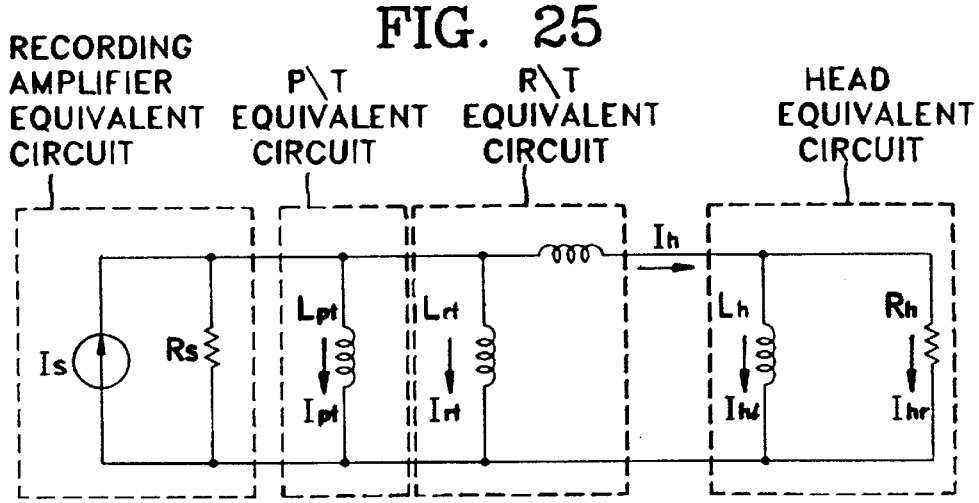
FIG. 25 is an equivalent circuit diagram of a recording system for explaining variations in an instantaneous value of a recording current.

FIG. 25 illustrates the equivalent circuits of a recording amplifier, a P/T, an R/T, and a head, which constitute a recording system with a focus given to the rise of the recording current. To determine the impact imposed by the lack of a DC current, the stray capacitor $C_s$ and the parallel stray capacitor $C_h$ are omitted, the ratio of the number of windings at the primary side to that of the windings of the secondary side in the R/T is given as 1, and a single magnetic head is provided. Thus, the constants of the equivalent circuit shown in FIG. 20B are defined as follows and corrected into constants shown in FIG. 25.

That is, $L_{pt}$ denotes an inductance at the primary side of the P/T, $L_{rt}$ denotes an inductance at the primary side of the R/T, $L_k$ denotes a leakage inductance of the R/T, $L_h$ denotes a parallel inductance of the magnetic head, $R_h$ denotes a parallel loss resistance of the magnetic head, $L_{prt}$ denotes a synthesized inductance of $L_{pt}$ and $L_{rt}$, $L_{hprt}$ denotes a parallel inductance of the P/T, R/T and head, $R_s$ denotes an output resistance of a recording amplifier, $I_{pt}$ denotes an exciting current of the P/T, $I_{rt}$ is an exciting current of the R/T, $I_{hl}$ denotes an exciting current of the head, $L_{prt}$ denotes a synthesized exciting current, $I_{hr}$ denotes a loss current of the head, $I_o$ denotes an output current for controlling a constant current, $I_s$ denotes an output current of the recording amplifier, $I_{do}$ denotes an initial value of the damper current, $\delta$ denotes an attenuation time constant of the damper current, $R_d$ denotes an on-resistance of the damper diode, s denotes a complex frequency jw, t denotes time, and ¶ denotes a delta function.

By these definitions, $$L_{prt}=(L_{pt} \cdot L_{rt})/(L_{pt}+L_{rt}) \tag{22}$$

$$I_{prt}=I_{pt}+I_{rt}$$

$$L_{hprt}=(L_h \cdot L_{prt})/(L_h+L_{prt}) \tag{23}$$

Here, $L_{prt} > L_k$ is generally encountered in practice, and for calculation simplicity, $L_k$ is included in $L_h$. Thus, the following approximate equation is obtained.

$$L_{prt} > L_k, L_h + L_k \to L_h (L_h > L_k) \tag{24}$$

where $\alpha \equiv R_h/L_{prt}$, $\beta \equiv R_h/L_h$, $\gamma \equiv R_h/L_{hprt}$ (thus, $\alpha+\beta=\gamma$), and $\delta \equiv R_d/L_{hprt}$.

As shown in FIGS. 23A and 23B, the output current $I_s$ of the recording amplifier is the sum of the constant current component $I_a (=I_o)$ controlled by the constant current controlling device and the current component $I_d(Q_s' \to L_t \to D)$.

With $R_d$ as the on-=resistance of the damper diode, the attenuation time constant $R_d/L_t$ of $I_d$ is given as $$L_t = L_{hprt} \text{ or } R_d/L_t = R_d/L_{hprt} = \delta \tag{25}$$

Therefore, $$I_d = I_{do} \cdot \exp(-\delta \cdot t) \text{ or } Id = I_{do} \cdot \P/(s+\delta) \tag{26}$$

$$I_a = I_0 \text{ or } I_a = I_0 \cdot (\P/s) \tag{27}$$

Accordingly, the output current $I_s$ of the recording amplifier is given by $$I_s = I_o + I_{do} \cdot \exp(-\delta \cdot t)$$

or, $$I_s = I_0 \cdot \P/s + I_{do} \cdot \P/(s+\delta) \tag{28}$$

Therefore, the synthesized exciting current $L_{prt}$ of the P/T and the R/T is calculated by $$\begin{aligned} I_{prt} &= \frac{1/(sL_{prt})}{1/(sL_{prt}) + 1/R_h} \\ &= \frac{a}{(s+r)} \cdot I_s \\ &= a \cdot I_0 \cdot [\P/s/(s+r)] + a \cdot I_{do} \cdot [\P/(s+\delta)/(s+r)] \\ &= I_o \cdot a/r[\P/s - \P/(s+r)] + \\ &\quad I_{do} \cdot a/(r-a)[\P/(s+a) - \P/(s+r)] \end{aligned} \tag{29}$$

Equation (29) is Laplace-transformed into $$I_{prt}=I_o \cdot (a/r) \cdot [1-\exp(-r \cdot t)] + I_{do} \cdot (a/r-a) \cdot [\exp(-\delta \delta \cdot t) - \exp(-r \cdot t)] \tag{30}$$

The head exciting current $L_{hl}$ is given by $$\begin{aligned} I_{hL} &= \frac{1/(sL_h)}{1/(sL_{prt}) + 1/R_h} \\ &= I_s \cdot \beta/(s+r) = \beta/\alpha \cdot I_{prt} \end{aligned} \tag{31}$$

where $\beta/\alpha = L_{prt}/L_h$.

Equation (31) is Laplace-transformed into $$L_{hl} = (\beta/\alpha) \cdot I_{prt} \tag{32}$$

In contrast, the head loss current $I_{hr}$ is given as $$\begin{aligned} I_{hr} &= \frac{1/R_h}{1/(sL_{hprt}) + 1/R_h} I_s \tag{33} \\ &= \frac{s}{s+r} I_s = \left(1 - \frac{r}{s+r}\right) I_s \\ &= I_o \cdot [\P/s - r \cdot \P/s/(s+r)] + \\ &\quad I_{do} \cdot [\P/(s-a) - r \cdot \P/(s+r)/(s+\delta)] \\ &= I_o \cdot [\P/(s+r)] + \\ &\quad I_{do} \cdot [r/(r-\delta) \cdot \P/(s+r) + \delta/(\delta-r) \cdot \P/(s+\delta)] \end{aligned}$$

Equation (33) is Laplace-transformed into $$I_{hr}=I_o \cdot \exp(-r \cdot t) + I_{do} \cdot [r/(r-\delta) \cdot \exp(-r \cdot t) + \delta/(\delta-r) \cdot \exp(-\delta \cdot t)] \tag{34}$$

where $$r/(r-\delta)=R_h/L_{hprt}/(R_h/L_{hprt}-R_d/L_{hprt})=1/(1-R_d/R_h)$$

$$\delta/(r-\delta)=R_d/(R_d-R_h)=-R_d/R_h/(1-R_d/R_h)$$

$$a/(r-\delta)=R_h/L_{hprt}/(R_h/L_{hprt}-R_d/L_{hprt})=(L_{hprt}/L_{hprt})/(1-R_d/R_h)$$

$$B/(r-\delta)=(L_{hprt}/L_h)/(1-R_d/R_h)$$

Therefore, $$\begin{aligned} I_{prt} = I_o &\cdot [(L_{hprt}/L_{hprt}) \cdot \{1 - \exp(-r \cdot t)\}] + \\ I_{do} &\cdot [(L_{hprt}/L_{hprt})/(1 - R_d/R_h) \cdot \{\exp(-\delta \cdot t) - \exp(-r \cdot t)\}] \end{aligned} \tag{35}$$

$$\begin{aligned} I_{hL} = I_o &\cdot [(L_{hprt}/L_h) \cdot \{1 - \exp(-r \cdot t)\}] + \\ I_{do} &\cdot [(L_{hprt}/L_h)/(1 - R_d/R_h) \cdot \{\exp(-\delta \cdot t) - \exp(-r \cdot t)\}] \end{aligned} \tag{36}$$

$$\begin{aligned} I_{hr} = I_o &\cdot \exp(-r \cdot t) + \\ I_{do} &\cdot [1(1 - R_d/R_h) \cdot \exp(-r \cdot t) + (-R_d/R_h)/(1 - R_d/R_h) \cdot \exp(-\delta \cdot t)] \end{aligned} \tag{37}$$

To further simplify these results, the on-resistance $R_d$ of the damper diode D is considered to be much smaller than the head loss resistance $R_h$.

$$R_h \gg R_d \tag{38}$$

Hence $$\begin{aligned} I_{prt} = I_o &\cdot [(L_{hprt}/L_{prt}) \cdot \{1 - \exp(-r \cdot t)\}] + \\ I_{do} &\cdot [(L_{hprt}/L_{prt}) \cdot \{\exp(-\delta \cdot t) - \exp(-r \cdot t)\}] = \\ (L_{hprt}/L_{prt})&[I_o \cdot \{1 - \exp(-r \cdot t)\} + I_{do} \cdot \{\exp(-\delta \cdot t) - \exp(-r \cdot t)\}] \end{aligned} \tag{39}$$

$$\begin{aligned} I_{hL} = I_o &\cdot [(L_{hprt}/L_h) \cdot \{1 - \exp(-r \cdot t)\}] + \\ I_{do} &\cdot [(L_{hprt}/L_h) \cdot \{\exp(-\delta \cdot t) - \exp(-r \cdot t)\}] = \\ (L_{hrpt}/L_h)&[I_o \cdot \{1 - \exp(-r \cdot t)\} + I_{do} \cdot \{\exp(-\delta \cdot t) - \exp(-r \cdot t)\}] \end{aligned} \tag{40}$$

$$I_{hr} = I_o \cdot \exp(-r \cdot t) + I_{do} \cdot \exp(-r \cdot t) \tag{41}$$

The current $I_a$ of the constant current source, the synthesized exciting current $I_{prt}$ of the P/T and the R/T, the head loss current $I_{hr}$, and the head exciting current $I_{hl}$ are illustrated in FIGS. 26A–26E.

Figure 26A:
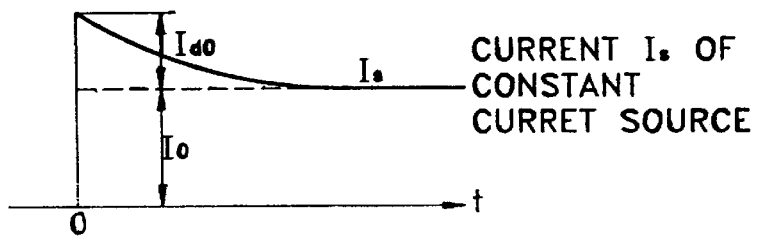
FIGS. 26A–26E are diagrams showing variations in the current of each portion in the circuit of FIG. 25.
Figure 26B:
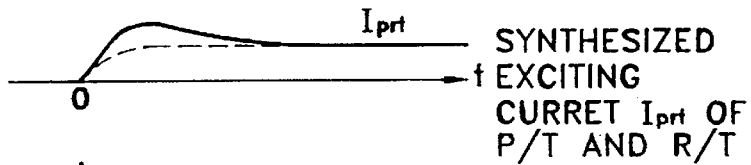
Figure 26C:
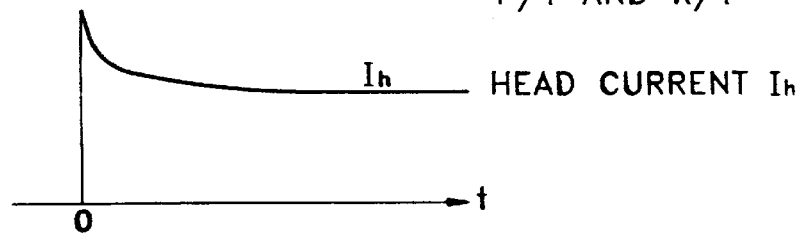
Figure 26D:
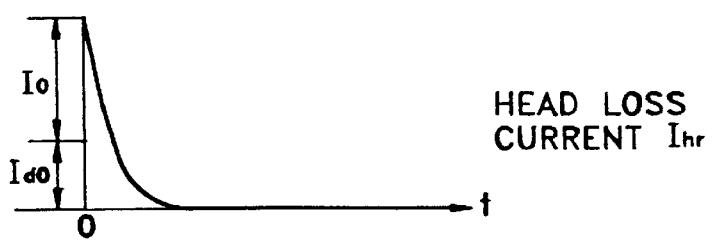
Figure 26E:
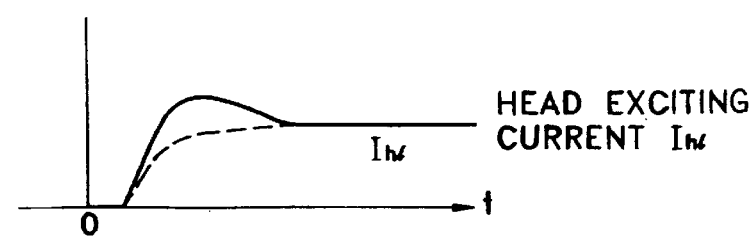

$I_s$ shown in FIG. 26A can be expressed as equation (28), $L_{prt}$ shown in FIG. 26B can be expressed as equation (39), $I_h$ shown in FIG. 26C is the sum of $I_{hr}$ and $I_{hl}$, $I_{hr}$ shown in FIG. 26D can be expressed as equation (41), and $I_{hl}$ shown in FIG. 26E can be expressed as equation (40).

In the recording amplifier of a switching type, an amplitude component $I_{do}$ of a transient pulse current in the current source output $I_s$ is generated by energies $E_{pt}$, $E_{rt}$, and $E_h$ accumulated in inductance loads $L_{pt}$, $L_{rt}$, and $L_h$ of the amplifier. By using the synthesized current $L_{prt}$ and synthesized inductance $L_{prt}$ of the P/T and the R/T, the value $E_{prt}$ of the accumulated energy can be given by $$E_{prt} = L_{pt} \cdot I_{pt}^2 / 2 + L_{rt} \cdot I_{pt}^2 / 2 \qquad (42)$$

The energy $E_h$ accumulated in the magnetic head inductance is given as $$E_h = L_h \cdot I_{hl}^2 / 2 \qquad (43)$$

Accordingly, the sum $E_t$ of the energies accumulated in the inductance loads $L_{prt}$ and $L_h$ of the recording amplifier is expressed as $$E_t = E_{prt} + E_h \qquad (44)$$

Figure 27:
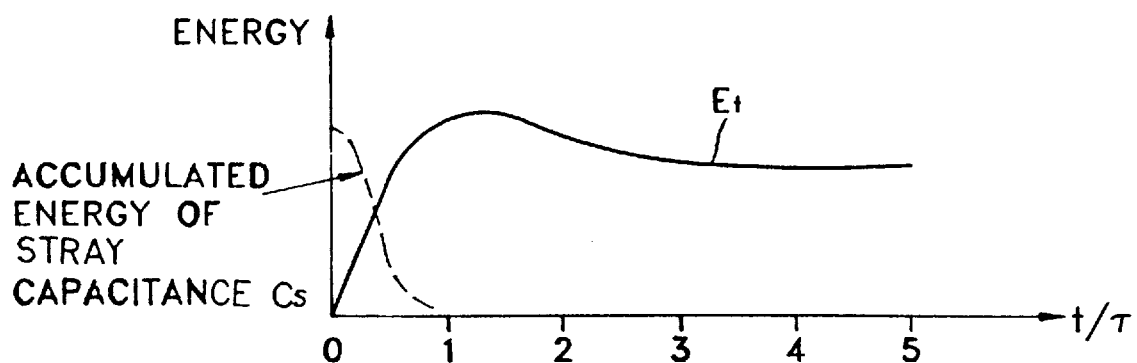
FIG. 27 is a diagram showing variations in the sum of energies accumulated in the load impedance of the recording amplifier shown in FIG. 25, in accordance with time passage.

Though $E_t$ is obtained by substituting equations (39)–(40) for equation (38), it can not be simplified into an equation. Thus, the result of this calculation is shown in FIG. 27. As shown in FIG. 27, though the accumulated energy Et generates an overshoot, it is attenuated as time goes on and converges into a predetermined value.

A current switching time t/τ corresponding to a bit length of input data having a discrete value varies to 1, 2, 3, or 4. The accumulated electromagnetic energy $E_t$ at the time point of a current switching is transferred to the parallel stray capacitor $C_s$ and converted into accumulated charge energy. Thus, as shown in FIGS. 28A–28C, flyback pulses are generated and the amplitudes of these pulses are proportional to the square root of the accumulated energy.

Figure 28A:
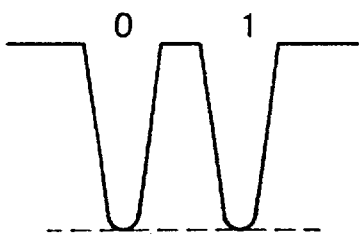
FIGS. 28A–28C illustrate variations in the amplitude of a flyback pulse corresponding to an input bit length.
Figure 28B:
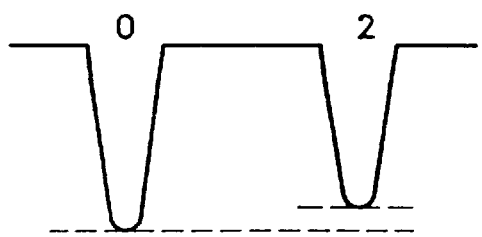
Figure 28C:
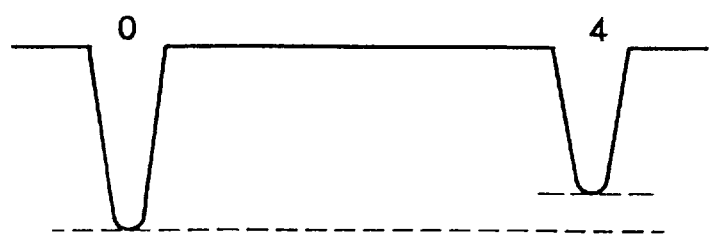

That is, FIG. 28A illustrates the amplitude of a flyback pulse in a switching time t/τ of 1, FIG. 28B illustrates the amplitude of a flyback pulse in a switching time t/τ of 2, and FIG. 28C illustrates the amplitude of a flyback pulse in a switching time t/τ of 4. From the figures, it is noted that the amplitude of the flyback pulse is attenuated with the passage of time.

The accumulated energy of $C_s$ is necessarily converted into electromagnetic energy and produces the initial value $I_{do}$ of a transient pulse current component. Thus, the recording amplifier of a flyback switching type, in which electromagnetic accumulated energy is attenuated with the passage of time, exhibits the problem that an instantaneous value at a current rise varies during the reversal of a current polarity.

Figure 29:
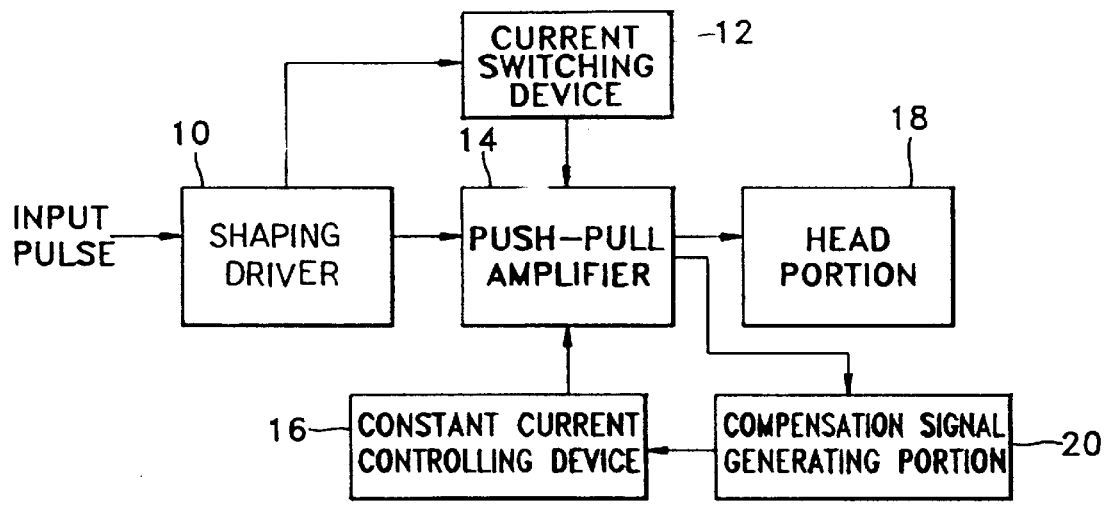
FIG. 29 is a block diagram of another embodiment of the recording amplifier shown in FIG. 13.

Another embodiment of the recording amplifier of a flyback switching type is illustrated in FIG. 29, to overcome the above problem.

In FIG. 29, the recording amplifiers has a shaping driver 10 for providing positive and negative signals corresponding to a binary coded input signal, a current switching device 12 for switching a current supplied to a push-pull amplifier 14 in response to the positive and negative signals, the push-pull amplifier 14 for receiving the positive and negative polarity signals and providing a recording current obtained by a rapid switching, a constant current controlling device 16 for controlling a constant current transmitted through the push-pull amplifier 14, and a compensation signal generating portion 20 for generating a compensation signal for controlling an instantaneous value to be a predetermined value against variations in the instantaneous value of the recording current.

Figure 30:
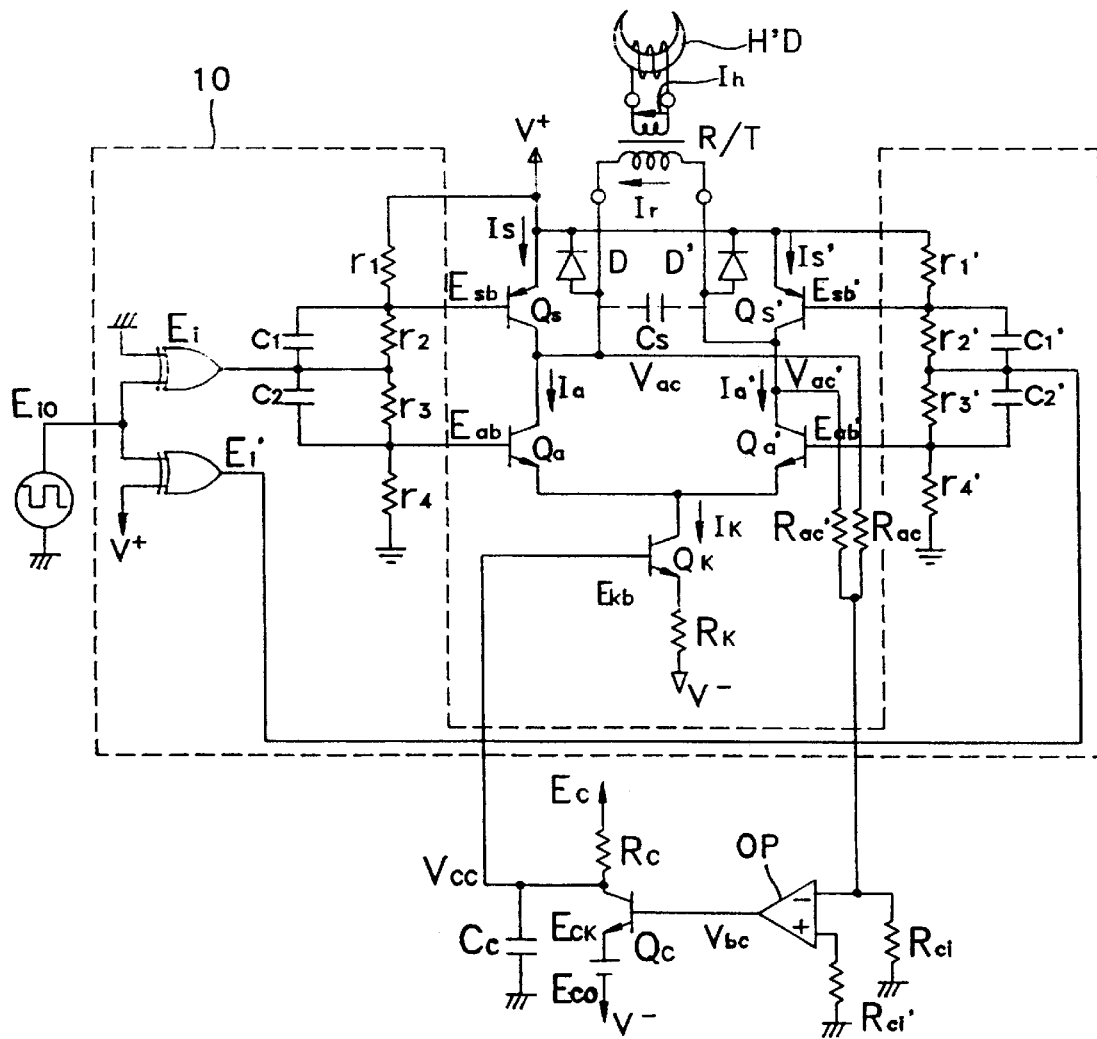
FIG. 30 is a detailed circuit diagram of the recording amplifier shown in FIG. 29.

FIG. 30 illustrates a circuit diagram of the recording amplifier shown in FIG. 29, for explaining the operational principle thereof.

In FIG. 30, amp transistors $Q_a$ and $Q_a'$ are npn transistors, and the current switching device 12 has pnp transistors $Q_s$ and $Q_s'$. Here, a common signal source $E_i$ is used to drive the bases of the transistors $Q_a$ and $Q_s$ and $E_{ab}$ and $E_{sb}$ are applied to the bases of the transistors $Q_a$ and $Q_a$, respectively, by resistance division from the common signal source $E_i$. The respective bases of the transistors $Q_a'$ and $Q_s'$ are driven by a common signal source $E_i'$ having a polarity reverse to that of $E_i$, and $E_{ab}'$ and $E_{sb}'$ are applied to the bases of the transistors $Q_a'$ and $Q_s'$, respectively, by resistance division from the common signal source $E_i'$.

A common collector of the transistors $Q_a$ and $Q_s$ is connected to one terminal of the primary side of an R/T, while a common collector of the transistors $Q_a'$ and $Q_s'$ is connected to the other terminal of the primary side of the R/T. Thus, a recording current is provided to the head via the R/T, or the R/T and P/T. A diode D is inserted between a DC voltage supply terminal V⁺ and the common collector of the transistors $Q_a$ and $Q_s$ while a diode D' is inserted between a DC voltage supply terminal V⁺ and the common collector of the transistors $Q_s'$ and $Q_s'$.

Meanwhile, the common emitter of the transistors $Q_a$ and $Q_s'$ is connected to the collector of a constant current controlling transistor $Q_k$, and the emitter of the constant current controlling transistor $Q_k$ is connected to a current feedback resistor $R_k$. Thus, a current $I_k$ ($=I_a+I_a'$) almost proportional to a base voltage $E_{kb}$ of the constant current controlling transistor $Q_k$ flows, thus controlling the peak-to-peak value of a normal amplitude of the recording current $I_r$.

The synthesized exciting current $I_{prt}$ of the P/T and R/T of equation (39) and the head exciting current $I_{hl}$ of equation (40) are given as follows:

$$I_{prt} = (L_{hprt}/L_{prt}) \cdot [(I_o+I_{do}) \cdot \{1-\exp(-r\cdot t)\} - I_{do} \cdot \{1-\exp(-\delta \cdot t)\}] \qquad (45)$$

$$I_{hl} = (L_{hprt}/L_h) \cdot [(I_o+I_{do}) \cdot \{1-\exp(-r\cdot t)\} - I_{do} \cdot \{1-\exp(-\delta \cdot t)\}] \qquad (46)$$

Since an attenuation time constant γ of a current component $I_o+I_{do}$ is larger than a time constant δ of a current component $I_{do}$, both components being included in the synthesized exciting current $I_{prt}$, $I_o+I_{do}$ immediately reaches a normal value, but it takes a relatively long time for $I_{do}$ to reach a normal value and thus the variation of $I_{prt}$ causes a problem.

To remove this current variation, the compensation current $\Delta I_{prt}$ is provided. Then, the synthesized current $I_{prt}$ does not vary and is maintained to be a predetermined value in spite of a change in the bit length of input data. Consequently, there is no variation in electromagnetic energy accumulated in the synthesized inductance $L_{prt}$ of the inductance $L_{rt}$ at the primary side of the R/T and the inductance Lpt at the primary side of the P/T.

$$\Delta I_{prt} = (L_{hprt}/L_{prt}) \cdot I_{do} \cdot (1-\exp(-\delta \cdot t)) \qquad (47)$$

$$I_{prt} + \Delta I_{prt} = (L_{hprt}/Lpr + I_{do})\{1-\exp(-r\cdot t)\} \qquad (48)$$

It is possible to prevent the variation of the head exciting current $I_{hl}$ by transmitting the same compensation current $\Delta I_{hl}$ expressed as equation (49) with respect to the head exciting current $I_{hl}$.

$$\Delta I_{hl} = (L_{hprt}/L_h) \cdot I_{do}\{1-\exp(-\delta \cdot t)\} \qquad (49)$$

Given the sum value of the compensation current as $\Delta I_{hprt}$, $$\Delta I_{hprt} = \Delta I_{prt} + \Delta I_{hf} = I_{do} \cdot \{1-\exp(-\delta \cdot t)\} \tag{50}$$

$$I_{hprt} + \Delta I_{hprt} = (I_o + I_{do}) \cdot \{1-\exp(-r \cdot t)\} \tag{51}$$

Thus, it is necessary to apply a compensation signal $V_{cc}$ for generating the compensation current $\Delta I_{hprt}$ to the base voltage $E_{kb}$ of the current controlling transistor $Q_k$. A method for generating $V_{cc}$ will be described in connection with the waveforms shown in FIGS. 31A–31E.

Figure 31A:
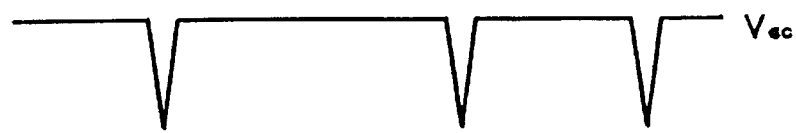
FIGS. 31A–31E illustrate the waveforms of input and output signals of the compensation signal generating portion shown in FIG. 29.
Figure 31B:
Figure 31C:
Figure 31D:

That is, flyback pulses shown in FIGS. 31A and 31B are generated in the collectors of the transistors $Q_a$ and $Q_a'$, after the reversal of the polarity of the recording current $I_r$. These flyback pulses are mixed via resistors $R_{ac}$, $R_{ac}'$, and $R_{ci}$, and amplified and polarity-reversed in an operation amplifier OP, thereby generating a synthesized pulse $V_{bc}$ shown in FIG. 31C. This pulse is applied to the base of a switching transistor $Q_c$ for generating a compensation signal. Here, a predetermined reference voltage $E(=E_{co}+V(-))$ is applied to the emitter of the switching transistor $Q_c$ and determined as a voltage for turning on the switching transistor $Q_c$. Therefore, the collector voltage $V_{cc}$ of the switching transistor $Q_c$ shows a charge and discharge waveform shown in FIG. 31D.

A parameter for forming this waveform is given by a power-supply voltage $E_c$ of $Q_c$ and a time constant $R_c C_c$ as follows:

$$V_{cc} = E_{ck} + (E_c - E_{ck})[1-\exp\{-t/R_c \cdot C_c\}] = E_{ck}[1+(E_c/E_{ck}-1)\{1-\exp(-t/R_c C_c)\}] \tag{52}$$

The compensation current $\Delta I_{hprt}$ can be generated by mating each integer of the above equation (52) with its counterpart of equation (51) and selecting a proper waveform-forming parameter.

Figure 31E:
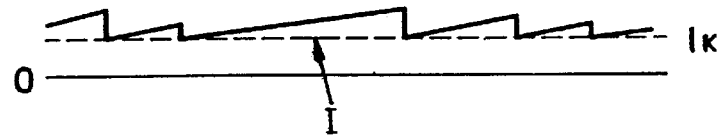

The waveform of the current $I_k$ flowing by the compensation voltage signal $V_{cc}$ (see FIG. 31D) injected into the base of the current controlling transistor $Q_k$ is illustrated in FIG. 31E.

As a result of injecting the compensation signal into the base of the current controlling transistor $Q_k$, the sum of electromagnetic energies accumulated in the inductances of a recording system are consistently conserved without any attenuation. Thus, despite a variation in a switching time of the recording current polarity corresponding to the bit length of input data, there is no change in the amplitude of a flyback pulse in contrast to the pulses shown in FIGS. 28A–28C. In other words, recording current rising characteristics (a rise time and a fall instantaneous value) at the moment of switching the polarity of the recording current can be maintained to be stable due to the very constant width and amplitude of the flyback pulse.

Figure 32:
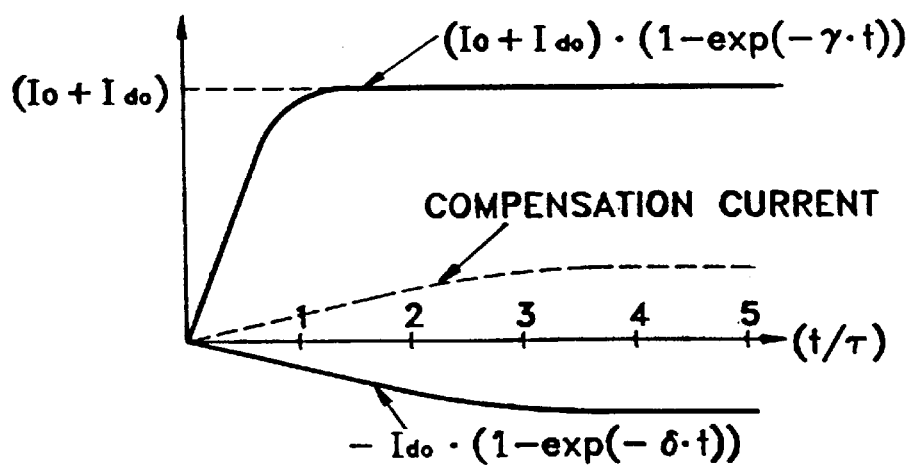
FIG. 32 illustrates the calculated value of a compensation current added to stabilize the switching characteristics of a recording current.

FIG. 32 shows the calculated values of compensation currents added to stabilize the switching characteristics of the recording current.

In the second embodiment of the present invention, the recording current rise characteristics during switching the polarity of the recording current can be stably maintained by compensating for a variation of the instantaneous value of the recording current resulting from use of a pulse transformer and a rotational transformer.

As described above, since the magnetic recording device of the present invention employs a switching recording amplifier for controlling a constant current, transistors used in the magnetic recording device exhibit low power dissipation and the need for a power transistor is obviated. These advantages enables fabrication of a compact and a low-power recording amplifiers.

Further, without an additional recording equalizer, the rise characteristics of the head current is improved and the head current has an overshoot characteristic, as well. Thus, the rise of the magnetic flux generated from the head current can be accelerated, the resolution of a magnetized pattern recorded on tape can be increased, and information can be recorded at a speed of several to tens of Mpbs with a high density.

The present invention that the rise characteristics of the recording current during switching the polarity of the recording current can be maintained to be very stable by controlling a constant current controlling device and thus adding a stabilizing compensation current, and the aperture rate of an eye pattern reproduced from a tape on which information is recorded by the recording device of the present invention is increased.

What is claimed is:

1. A magnetic recording device for recording a digital signal by providing a recording current indicative of digital information to a magnetic head, comprising:

a shaping driver for generating positive and negative signals whose polarities are reversed, corresponding to said digital information;

push-pull amplifier receiving said positive and negative signals and generating a recording current corresponding to said positive and negative signals, and further generating a transient pulse current during reversal of the polarity of said recording current; and current switching circuit receiving said positive and negative signals and switching a current flowing through said push-pull amplifier in response to said positive and negative signals, wherein said digital signal is recorded on said magnetic recording medium on the basis of said transient pulse current.

2. A magnetic recording device as claimed in claim 1, further comprising constant current controlling circuit for controlling current signals provided to said push-pull means to be constant.

3. A magnetic recording device as claimed in claim 1, further comprising:

means for generating a compensation signal against a variation in the instantaneous value of the recording current generated in said push-pull means; and constant current controlling circuit for controlling said instantaneous value of said recording current to be constant in response to said compensation signal.

4. A magnetic recording device for recording a digital signal by providing a recording current indicative of digital information to a magnetic head, comprising:

a shaping driver for generating positive and negative signals whose polarities are reversed, corresponding to said digital information;

a pair of switches for switching said positive and negative current signals;

a first amplifying device for generating a recording current corresponding to a current signal switched by one of said pair of switches and generating a transient pulse current during reversal of the polarity of said recording current to said magnetic head;

a second amplifying device for generating a recording current corresponding to a current signal switched by the other switch and generating a transient pulse current during reversal of the polarity of said recording current to said magnetic head; and a constant current controlling device for controlling a constant current flowing through said first and second amplifying devices;

wherein said transient pulse current flows through said magnetic head and consequently a digital signal is recorded on said magnetic recording medium.

5. A magnetic recording device as claimed in claim 4, further comprising:

a first damper device having one end inserted between one of said pair of switches and said first amplifying device, and the other end connected to a power source; and a second damper device having one end inserted between the other switch and said second amplifying device, and the other end connected to said power source, wherein said transient current rapidly converges into a normal current value by means of said first and second damper devices.

6. A magnetic recording device for recording a digital signal by providing a generated recording current corresponding to digital information via a rotary transformer to a magnetic head and magnetizing a magnetic recording medium, comprising:

a shaping driver for providing positive and negative current signals whose polarities are reversed;

a pair of switches for switching based on said positive and negative current signals;

a first amplifying device for generating a first recording current corresponding to a current signal switched by one of said pair of switches and generating a transient pulse current during reversal of the polarity of said first recording current to said magnetic head;

a second amplifying device for generating a second recording current corresponding to a current signal switched by the other switch and generating a transient pulse current during reversal of the polarity of said second recording current to said magnetic head; and a compensation signal generator for generating a compensation signal in the form of a voltage signal according to variations of the instantaneous value of the generated recording current driven by passage of the first and second recording currents via said rotary transformer; and a constant current controlling device for controlling said instantaneous value of said first and second recording currents to be constant in response to said compensation signal, wherein said transient pulse current flows through said magnetic head and consequently a digital signal is recorded on said magnetic recording medium.

7. A magnetic recording device as claimed in claim 6, further comprising:

a first damper device having one end inserted between one of said pair of switches and said first amplifying device, and the other end connected to a power source; and a second damper device having one end inserted between the other switch and said second amplifying device, and the other end connected to said power source, wherein said transient current rapidly converges into a normal current value by means of said first and second damper devices.

8. A magnetic recording device for recording a digital signal by providing a recording current indicative of digital information to a magnetic head comprising:

a shaping driver for generating positive and negative signals whose polarities are reversed, corresponding to said digital information;

a first complementary semiconductor device for generating a recording current corresponding to said positive signal and generating a transient pulse current during reversal of the polarity of said recording current to said magnetic head;

a second complementary semiconductor device connected in parallel to said first complementary semiconductor device, for generating a transient pulse current during reversal of the polarity of said recording current to said magnetic head; and a constant current controlling device commonly connected to said first and second complementary semiconductor devices, wherein a digital signal is recorded in said magnetic recording medium on the basis of said transient pulse current.

9. A magnetic recording device as claimed in claim 8, further comprising:

a pair of switches for switching said positive and negative current signals;

a first damper device having one end inserted between one of said pair of switches and said first amplifying device, and the other end connected to a power source; and a second damper device having one end inserted between the other switch and said second amplifying device, and the other end connected to said power source, wherein said transient current rapidly converges into a normal current value by means of said first and second damper devices.

10. A magnetic recording device for recording a digital signal by providing a recording current corresponding to digital information via a rotary transformer to a magnetic head and magnetizing a magnetic recording medium, comprising:

a shaping driver for generating positive and negative signals whose polarities are reversed, corresponding to said digital information;

a first complementary semiconductor device for generating a recording current corresponding to said positive signal and generating a transient pulse current during reversal of the polarity of said recording current to said magnetic head;

a second complementary semiconductor device connected in parallel to said first complementary semiconductor device, for generating a transient pulse current during reversal of the polarity of said recording current to said magnetic head;

a compensation signal generator for generating a compensation signal in the form of a voltage signal according to a variation of the instantaneous value of a generated recording current driven by passage of said recording current via said rotary transformer; and a constant current controlling device commonly connected to said first and second complementary semiconductor devices, wherein a digital signal is recorded on said magnetic recording medium on the basis of said transient pulse current.

11. A magnetic recording device as claimed in claim 10, further comprising:

a pair of switches for switching said positive and negative current signals;

a first damper device having one end inserted between one of said pair of switches and said first amplifying device, and the other end connected to a power source; and a second damper device having one end inserted between the other switch and said second amplifying device, and the other end connected to said power source, wherein said transient current rapidly converges into a normal current value by means of said first and second damper devices.

12. A magnetic recording device for recording a digital signal by providing a recording current corresponding to digital information to a magnetic head and reproducing said recorded digital signal, comprising:

a shaping driver for generating positive and negative signals whose polarities are reversed, corresponding to said digital information;

first and second DC voltage supply terminals for receiving predetermined first and second DC voltages;

a first pnp transistor having a base connected to said shaping driver and an emitter connected to said first DC voltage supply terminal, for activation according to said positive signal;

a second pnp transistor having a base connected to said shaping driver and an emitter connected to said first DC voltage supply terminal, for activation according to said positive signal;

a first npn transistor having a base connected to said shaping driver and a collector connected to the collector of said first pnp transistor, for generating a rising pulse current at the moment when said first pnp transistor is turned off and providing said rising pulse current as a recording current to said magnetic head;

a second npn transistor having a base connected to said shaping driver and a collector connected to the collector of said second pnp transistor, for generating a rising pulse current at the moment when said second pnp transistor is turned off and providing said rising pulse current as a recording current to said magnetic head;

a third npn transistor having a base connected to said first DC voltage supply terminal, a collector connected commonly to the emitters of said first and second npn transistors, and an emitter connected to a variable resistor which is connected to said second DC voltage supply terminal;

wherein a digital signal is recorded on said magnetic recording medium on the basis of said rising pulse current.

13. A magnetic recording device as claimed in claim 12, wherein a transient pulse current is generated to have rise characteristics rapidly improved by adjusting the magnitudes of said first and second DC voltages, turning off said first to third npn transistors during switching of the polarity of said recording current, and applying a voltage corresponding to the power source to a magnetic head.

14. A magnetic recording device as claimed in claim 12, further comprising:

a first damper device having one end connected to the common collector of said first pnp transistor and said first npn transistor, and the other end connected to said first DC voltage supply terminal; and a second damper device having one end connected to the common collector of said second pnp transistor and said second npn transistor, and the other end connected to said first DC voltage supply terminal, wherein a rising pulse current rapidly converges into a normal current value by means of said first and second damper devices.

15. A magnetic recording device for recording a digital signal by providing a recording current corresponding to digital information to a magnetic head and reproducing said recorded digital signal, comprising:

a shaping driver for generating positive and negative signals whose polarities are reversed, corresponding to said digital information;

first and second DC voltage supply terminals for receiving predetermined first and second DC voltages;

a first pnp transistor having a base connected to said shaping driver and an emitter connected to said first DC voltage supply terminal, for activating on according to said negative signal;

a second pnp transistor having a base connected to said shaping driver and an emitter connected to said first DC voltage supply terminal, for activating according to said positive signal;

a first npn transistor having a base connected to said shaping driver and a collector connected to the collector of said first pnp transistor, for generating a rising pulse current at the moment when said first pnp transistor is turned off and providing said rising pulse current as a recording current to said magnetic head;

a second npn transistor having a base connected to said shaping driver and a collector connected to the collector of said second pnp transistor, for generating a rising pulse current at the moment when said second pnp transistor is turned off and providing said rising pulse current as a recording current to said magnetic head;

a comparator connected to the collectors of said first and second npn transistors, for comparing a predetermined reference value with an instantaneous value of the recording current changed due to the passage of said recording current via said rotary transformer;

an integrator for integrating the output of said comparator and generating a compensation signal; and a third npn transistor having a base connected to said first DC voltage supply terminal, a collector connected commonly to the emitters of said first and second npn transistors, and an emitter connected to a variable resistor which is connected to said second DC voltage supply terminal;

wherein a digital signal is recorded in said magnetic recording medium on the basis of said rising pulse current.

16. A magnetic recording device as claimed in claim 15, wherein a transient pulse current is generated to have rise characteristics rapidly improved by adjusting the magnitudes of said first and second DC voltages, turning off said first to third npn transistors during switching of the polarity of said recording current, and applying a voltage corresponding to the power source to a magnetic head.

17. A magnetic recording device as claimed in claim 15, further comprising:

a first damper device having one end connected to the common collector of said first pnp transistor and said first npn transistor, and the other end connected to said first DC voltage supply terminal; and a second damper device having one end connected to the common collector of said second pnp transistor and said second npn transistor, and the other end connected to said first DC voltage supply terminal, wherein a rising pulse current rapidly converges into a normal current value by means of said first and second damper devices.

18. A magnetic recording method for recording a digital signal on a magnetic recording medium by a recording current indicative of digital information provided to a magnetic head, said method comprising the steps of:

generating positive and negative signals whose polarities are reversed, corresponding to said digital information; and generating a recording current corresponding to said positive and negative signals, generating a transient pulse current during switching of the polarity of said recording current, and providing said transient pulse current to said magnetic head, wherein said digital signal is recorded on said magnetic recording medium on the basis of said transient pulse current.

19. A magnetic recording method as claimed in claim 18, further comprising the steps of:

generating a compensation signal against a variation in the instantaneous value of said recording current; and controlling the instantaneous value of said recording current to be constant in response to said compensation signal.

* * * * *